US012720980B2

(12) United States Patent
Kobayashi et al.

(10) Patent No.: US 12,720,980 B2
(45) Date of Patent: Aug. 25, 2026

(54) DISPLAY APPARATUS

(71) Applicant: Semiconductor Energy Laboratory Co., Ltd., Atsugi (JP)

(72) Inventors: Hidetomo Kobayashi, Isehara (JP); Hideaki Shishido, Atsugi (JP); Shuichi Katsui, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 486 days.

(21) Appl. No.: 18/287,928

(22) PCT Filed: Apr. 20, 2022

(86) PCT No.: PCT/IB2022/053666
§ 371 (c)(1),
(2) Date: Oct. 23, 2023

(87) PCT Pub. No.: WO2022/229790
PCT Pub. Date: Nov. 3, 2022

(65) Prior Publication Data

US 2024/0196650 A1 Jun. 13, 2024

(30) Foreign Application Priority Data

Apr. 30, 2021 (JP) ................................ 2021-077439
Nov. 30, 2021 (JP) ................................ 2021-194087

(51) Int. Cl.
*H10K 59/121* (2023.01)
*H10K 50/00* (2023.01)
*H10K 59/131* (2023.01)

(52) U.S. Cl.
CPC .......... *H10K 59/131* (2023.02); *H10K 50/00* (2023.02); *H10K 59/1213* (2023.02)

(58) Field of Classification Search
CPC .... H10K 59/873; H10K 59/131; H10K 59/40; H10K 59/1213; H10K 59/126; H10K 59/80524; H10K 50/00
See application file for complete search history.

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

CN 001490778 A 4/2004
CN 001498040 A 5/2004
(Continued)

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.
(Continued)

*Primary Examiner* — Suberr L Chi
(74) *Attorney, Agent, or Firm* — Eric J. Robinson; Robinson Intellectual Property Law Office, P.C.

(57) ABSTRACT

A novel display apparatus is provided. The display apparatus includes a first wiring, a second wiring, a first transistor, and a plurality of second transistors. The first wiring extends in a first direction and is supplied with a gate signal. The second wiring extends in a second direction intersecting the first direction and is supplied with a source signal. A gate of the first transistor is electrically connected to the first wiring, one of a source and a drain of the first transistor is electrically connected to the second wiring, and the other of the source and the drain of the first transistor is electrically connected to each gate of the plurality of second transistors. The plurality of second transistors are connected in series or in parallel. The first transistor includes a first semiconductor
(Continued)

layer in which current flows in the first direction or the second direction.

19 Claims, 24 Drawing Sheets

(56) References Cited

U.S. PATENT DOCUMENTS

| | | | |
|---|---|---|---|
| 6,501,448 | B1 | 12/2002 | Komiya et al. |
| 7,417,605 | B2 | 8/2008 | Kasai |
| 7,671,826 | B2 | 3/2010 | Kimura |
| 8,264,430 | B2 | 9/2012 | Kimura |
| 8,717,261 | B2 | 5/2014 | Kimura |
| 9,276,037 | B2 | 3/2016 | Kimura |
| 9,858,858 | B2 | 1/2018 | Seo et al. |
| 10,535,318 | B2 | 1/2020 | Du et al. |
| 10,831,291 | B2 * | 11/2020 | Yamazaki ......... G02F 1/133514 |
| 12,089,459 | B2 | 9/2024 | Kobayashi et al. |
| 2002/0072139 | A1 | 6/2002 | Kashiwabara |
| 2002/0113546 | A1 | 8/2002 | Seo et al. |
| 2004/0130262 | A1 | 7/2004 | Yoneda |
| 2007/0126665 | A1 | 6/2007 | Kimura |
| 2007/0200802 | A1 | 8/2007 | Kasai |
| 2010/0289832 | A1 | 11/2010 | Yamamoto et al. |
| 2011/0148290 | A1 | 6/2011 | Oota |
| 2012/0256204 | A1 | 10/2012 | Yoshizumi et al. |
| 2012/0273804 | A1 | 11/2012 | Hatano |
| 2012/0276484 | A1 | 11/2012 | Izumi et al. |
| 2013/0084531 | A1 | 4/2013 | Hamaguchi et al. |
| 2013/0084664 | A1 | 4/2013 | Yoshitoku et al. |
| 2013/0084666 | A1 | 4/2013 | Oshige |
| 2013/0280839 | A1 | 10/2013 | Sonoda et al. |
| 2013/0295705 | A1 | 11/2013 | Sonoda et al. |
| 2014/0004640 | A1 | 1/2014 | Hamaguchi et al. |
| 2014/0004642 | A1 | 1/2014 | Otsuka et al. |
| 2015/0060826 | A1 | 3/2015 | Matsumoto. et al. |
| 2015/0069360 | A1 | 3/2015 | Sato |
| 2015/0076476 | A1 | 3/2015 | Odaka et al. |
| 2016/0086534 | A1 | 3/2016 | Seo et al. |
| 2016/0172595 | A1 | 6/2016 | Malinowski et al. |
| 2016/0315133 | A1 | 10/2016 | Sato |
| 2017/0019972 | A1 | 1/2017 | Kimura et al. |
| 2017/0047003 | A1 | 2/2017 | Kim et al. |
| 2017/0141167 | A1 | 5/2017 | Naganuma |
| 2017/0256754 | A1 | 9/2017 | Defranco et al. |
| 2018/0005668 | A1 | 1/2018 | Shionoiri et al. |
| 2018/0090103 | A1 | 3/2018 | Zhang et al. |
| 2018/0190908 | A1 | 7/2018 | Ke et al. |
| 2019/0122626 | A1 | 4/2019 | Du et al. |
| 2019/0378859 | A1 | 12/2019 | Kawashima et al. |
| 2020/0203662 | A1 | 6/2020 | Mollard et al. |
| 2021/0242220 | A1 | 8/2021 | Yamazaki et al. |
| 2021/0311341 | A1 | 10/2021 | Kawashima et al. |

FOREIGN PATENT DOCUMENTS

| | | | |
|---|---|---|---|
| CN | 101313348 | A | 11/2008 |
| CN | 101887684 | A | 11/2010 |
| CN | 107077819 | A | 8/2017 |
| CN | 109426041 | A | 3/2019 |
| JP | 2000-036385 | A | 2/2000 |
| JP | 2000-221903 | A | 8/2000 |
| JP | 2002-324673 | A | 11/2002 |
| JP | 2003-059663 | A | 2/2003 |
| JP | 2004-117820 | A | 4/2004 |
| JP | 2004-126106 | A | 4/2004 |
| JP | 2007-179042 | A | 7/2007 |
| JP | 2008-098106 | A | 4/2008 |
| JP | 2008-147072 | A | 6/2008 |
| JP | 2008-251270 | A | 10/2008 |
| JP | 2009-294508 | A | 12/2009 |
| JP | 2010-049159 | A | 3/2010 |
| JP | 2010-266490 | A | 11/2010 |
| JP | 2012-160473 | A | 8/2012 |
| JP | 2014-120218 | A | 6/2014 |
| JP | 2014-135251 | A | 7/2014 |
| JP | 2014-232568 | A | 12/2014 |
| JP | 2015-115178 | A | 6/2015 |
| JP | 2016-197494 | A | 11/2016 |
| JP | 2017-533457 | | 11/2017 |
| JP | 2019-179696 | A | 10/2019 |
| JP | 2020-160305 | A | 10/2020 |
| JP | 2020-531873 | | 11/2020 |
| KR | 2000-0071311 | A | 11/2000 |
| KR | 2004-0027339 | A | 4/2004 |
| KR | 2004-0030320 | A | 4/2004 |
| KR | 2010-0122442 | A | 11/2010 |
| KR | 2011-0130536 | A | 12/2011 |
| KR | 2017-0020571 | A | 2/2017 |
| KR | 2017-0057367 | A | 5/2017 |
| TW | 520615 | | 2/2003 |
| TW | 200405259 | | 4/2004 |
| TW | 200406135 | | 4/2004 |
| TW | 200735370 | | 9/2007 |
| TW | 201044353 | | 12/2010 |
| WO | WO-2007/063814 | | 6/2007 |
| WO | WO-2016/043873 | | 3/2016 |
| WO | WO-2018/087625 | A | 5/2018 |
| WO | WO-2019/037440 | | 2/2019 |
| WO | WO-2020/229911 | | 11/2020 |

OTHER PUBLICATIONS

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

International Search Report (Application No. PCT/IB2022/053666) Dated Jul. 12, 2022.

Written Opinion (Application No. PCT/IB2022/053666) Dated Jul. 12, 2022.

* cited by examiner

FIG. 2A
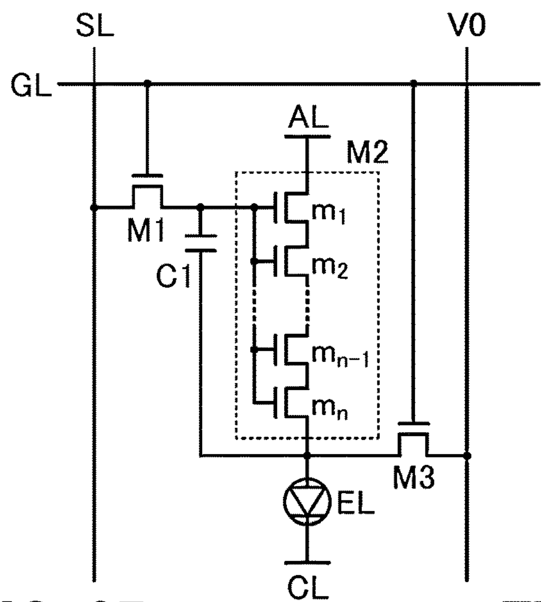
FIG. 2B
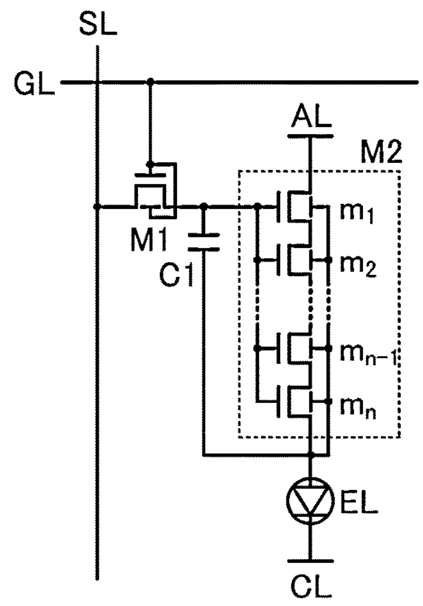
FIG. 2C
SL
V0
GL
AL
M2
$m_1$
M1
$m_2$
C1
$m_{n-1}$
$m_n$
M3
EL
CL
FIG. 2D
M2
$m_1$
$m_1$
$m_2$
$m_{n-1}$
$m_n$
FIG. 2E
M2
$m_1$
$m_2$
$m_{n-1}$
$m_n$ 10c
10
10
10
10

10c
21
21
41
41
41
41
41
41
41
41
22
31
A5
A6

10c
41 21 41 41 41 41 41 41 21 41
52
51
A1
A2
31n 31n 31n 31n 22 31i 31n 31n 31n 31n 24
20X
Y
X 23
20X
Y
X 21
30a
30b
22
20X
Y
X 31a
22
31b
30b
30a
20X
32
Y
X 31a
31b
20X
32
Y
X 24
20X
Y
X 23
20X
Y
X 21
30d
30a
20X
22
30b
30c
Y
X 31a
22
31d
30d
30a
20X
11
32
29
31b
30b
31c
30c
Y
X 31a
31d
20X
32
31b
31c
Y
X 200A
250R
250G
202
255B
255R
255G
264
263
257
254
235
253W
256
252G
252R
251
262
242
243
240
241
234
233
224
223
220
225
261
221
232
226
227
231
203
273
272
271
210
215
201
212
211
213
214

DISPLAY APPARATUS

TECHNICAL FIELD

One embodiment of the present invention relates to a display apparatus. One embodiment of the present invention relates to an electronic device including a display apparatus.

Note that one embodiment of the present invention is not limited to the above technical field. Examples of a technical field of one embodiment of the present invention disclosed in this specification and the like include a semiconductor device, a display apparatus, a light-emitting apparatus, a power storage device, a memory device, an electronic device, a lighting device, an input device, an input/output device, a driving method thereof, and a manufacturing method thereof. A semiconductor device refers to any device that can function by utilizing semiconductor characteristics.

BACKGROUND ART

In recent years, the resolution of a display panel has been increased. As a device that requires a high-resolution display panel, a device for virtual reality (VR) or augmented reality (AR) has been actively developed in recent years.

Examples of a display apparatus that can be used for a display panel include, typically, a light-emitting apparatus including a light-emitting element such as an organic EL (Electro Luminescence) element or a light-emitting diode (LED), a liquid crystal display apparatus, and electronic paper performing display by an electrophoretic method or the like.

The basic configuration of an organic EL element is a configuration in which a layer containing a light-emitting organic compound is provided between a pair of electrodes. By voltage application to this element, light emission can be obtained from the light-emitting organic compound. A display apparatus using such an organic EL element does not need a backlight that is necessary for a liquid crystal display apparatus and the like; thus, a thin, lightweight, high-contrast, and low-power display apparatus can be achieved. Patent Document 1, for example, discloses an example of a display apparatus using an organic EL element.

REFERENCE

Patent Document

[Patent Document 1] Japanese Published Patent Application No. 2002-324673

SUMMARY OF THE INVENTION

Problems to be Solved by the Invention

In the above-described device for VR or AR that is wearable, a lens for focus adjustment needs to be provided between eyes and the display panel since the distance between eyes and the display panel is short. Since part of the screen is enlarged by the lens, low resolution of the display panel might cause a problem of weak sense of reality and immersion.

In addition, in the case of a battery-driven device, the power consumption of the display panel needs to be reduced in order that the continuous use time can be prolonged. In particular, a device for AR is required to have high luminance because an image is displayed to be overlaid on external light.

An object of one embodiment of the present invention is to provide a display apparatus with high resolution. An object of one embodiment of the present invention is to provide a display apparatus with low-power consumption. An object of one embodiment of the present invention is to provide a display apparatus with high luminance. An object of one embodiment of the present invention is to provide a display apparatus with a high aperture ratio. An object of one embodiment of the present invention is to provide a highly reliable display apparatus.

An object of one embodiment of the present invention is to provide a novel display apparatus, display module, or electronic device. Alternatively, an object of one embodiment of the present invention is to provide a method for manufacturing the above-described display apparatus with high yield. An object of one embodiment of the present invention is to at least reduce at least one of problems of the conventional technique.

Note that the description of these objects does not preclude the existence of other objects. Note that one embodiment of the present invention does not have to achieve all the objects. Note that objects other than these can be derived from the description of the specification, the drawings, the claims, and the like.

Means for Solving the Problems

One embodiment of the present invention is a display apparatus including a first wiring, a second wiring, a first transistor, and a plurality of second transistors. The first wiring extends in a first direction and is supplied with a gate signal. The second wiring extends in a second direction intersecting the first direction and is supplied with a source signal. A gate of the first transistor is electrically connected to the first wiring, one of a source and a drain of the first transistor is electrically connected to the second wiring, and the other of the source and the drain is electrically connected to each gate of the plurality of second transistors. The plurality of second transistors are connected in series. The first transistor includes a first semiconductor layer where current flows in the first direction or the second direction. The plurality of second transistors each include a second semiconductor layer where current flows in the first direction or the second direction.

Another embodiment of the present invention is a display apparatus including a first wiring, a second wiring, a first transistor, and a plurality of second transistors. The first wiring extends in a first direction and is supplied with a gate signal. The second wiring extends in a second direction intersecting the first direction and is supplied with a source signal. A gate of the first transistor is electrically connected to the first wiring, one of a source and a drain of the first transistor is electrically connected to the second wiring, and the other of the source and the drain is electrically connected to each gate of the plurality of second transistors. One of a source and a drain of each of the plurality of second transistors is electrically connected, and the other of the source and the drain of each of the plurality of second transistors is electrically connected. The first transistor includes a first semiconductor layer where current flows in the first direction or the second direction. The plurality of second transistors each include a second semiconductor layer where current flows in the first direction or the second direction.

Any of the above preferably includes a light-emitting element including an anode and a cathode. It is preferable that one of the source and the drain of one of the plurality of second transistors be electrically connected to the anode or the cathode.

In any of the above, it is preferable that channel lengths of the plurality of second transistors be substantially equal to each other, and channel widths of the plurality of second transistors be substantially equal to each other.

In any of the above, it is preferable that channel lengths of the first transistor and each of the plurality of second transistors be substantially equal to each other, and channel widths of the first transistor and each of the plurality of the second transistors be substantially equal to each other.

In any of the above, it is preferable that two adjacent second transistors in the plurality of second transistors each include a channel formation region in one island-shaped second semiconductor layer.

In any of the above, it is preferable that each of the plurality of second transistors include the second semiconductor layer, and the plurality of second semiconductor layers be arranged at regular intervals in the first direction or the second direction.

In any of the above, the second semiconductor layer preferably contains a metal oxide containing one or both of indium and zinc. The first semiconductor layer preferably contains the same metal oxide as the second semiconductor layer.

In any of the above, a third transistor is preferably included. The third transistor includes a third semiconductor layer. It is preferable that the third semiconductor layer contain the same semiconductor material as the first semiconductor layer, and include a portion having substantially the same top surface shape as the first semiconductor layer. In the third transistor, at least one of a gate, a source, and a drain is electrically floating.

Effect of the Invention

According to one embodiment of the present invention, a display apparatus with high resolution can be provided. Alternatively, a display apparatus with low-power consumption can be provided. Alternatively, a display apparatus with high luminance can be provided. Alternatively, a display apparatus with a high aperture ratio can be provided. Alternatively, a highly reliable display apparatus can be provided.

According to one embodiment of the present invention, a novel display apparatus, display module, electronic device, or the like can be provided. Alternatively, a method for manufacturing the above-described display apparatus with high yield can be provided. Alternatively, at least one of problems of the conventional technique can be at least reduced.

Note that the description of these effects does not preclude the existence of other effects. Note that one embodiment of the present invention does not need to have all of these effects. Note that effects other than these can be derived from the description of the specification, the drawings, the claims, and the like.

BRIEF DESCRIPTION OF THE DRAWINGS

FIG. 2A to FIG. 2E are diagrams illustrating configuration examples of a pixel circuit.

FIG. 7A to FIG. 7E are diagrams illustrating structure examples of transistors.

MODE FOR CARRYING OUT THE INVENTION

Figure 1A:
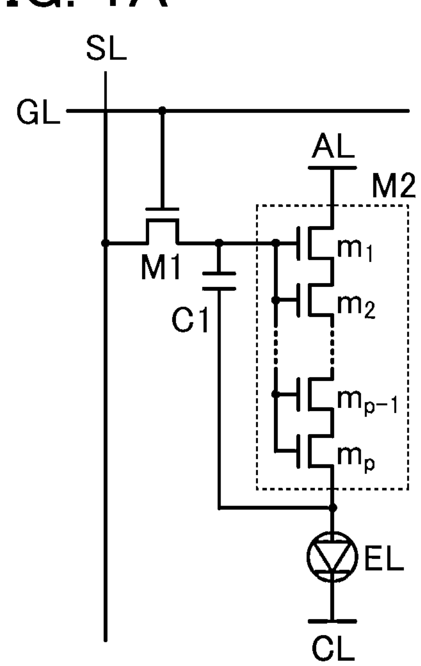
FIG. 1A to FIG. 1C are diagrams illustrating configuration examples of a pixel circuit.

Embodiments will be described below with reference to the drawings. Note that the embodiments can be implemented with many different modes, and it will be readily understood by those skilled in the art that modes and details thereof can be changed in various ways without departing from the spirit and scope thereof. Therefore, the present invention should not be construed as being limited to the description of embodiments below.

Note that in structures of the invention described below, the same reference numerals are commonly used for the same portions or portions having similar functions in different drawings, and a repeated description thereof is omitted. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, they are not limited to the illustrated scale.

Note that in this specification and the like, ordinal numbers such as "first" and "second" are used in order to avoid confusion among components and do not limit the number.

Note that in this specification and the like, the expression "top surface shapes are substantially aligned with each other" means that at least outlines of stacked layers partly overlap with each other. For example, the case of processing the upper layer and the lower layer with the use of the same mask pattern or mask patterns that are partly the same is included. However, in some cases, the outlines do not completely overlap with each other and the upper layer is positioned on an inner side of the lower layer or the upper layer is positioned on an outer side of the lower layer; such a case is also represented by the expression "top surface shapes are substantially aligned with each other".

Note that the expressions indicating directions such as "over" and "under" are basically used to correspond to the directions of drawings. However, in some cases, the direction indicating "over" or "under" in the specification does not correspond to the direction in the drawings for the purpose of description simplicity or the like. For example, when a stacking order (or formation order) of a stacked body or the like is described, even in the case where a surface on which the stacked body is provided (e.g., a formation surface, a support surface, an adhesion surface, or a planar surface) is positioned above the stacked body in the drawings, the direction and the opposite direction are expressed using "under" and "over", respectively, in some cases.

Note that in this specification, an EL layer means a layer containing at least a light-emitting substance (also referred to as a light-emitting layer) or a stacked body including the light-emitting layer provided between a pair of electrodes of a light-emitting element.

In this specification and the like, a display panel that is one embodiment of a display apparatus has a function of displaying (outputting) an image or the like on (to) a display surface. Therefore, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Embodiment 1

In this embodiment, structure examples of a display apparatus according to one embodiment of the present invention are described.

One embodiment of the present invention is a display apparatus including a plurality of pixels arranged in a matrix. The display apparatus includes a plurality of gate lines (first wirings) supplied with gate signals (also referred to as scan signals or the like) and a plurality of source lines (second wirings) supplied with source signals (also referred to as video signals, data signals or the like). The gate lines are provided so as to extend in a first direction, and the source lines are provided so as to extend in a second direction that intersects the first direction.

Each pixel is provided for the intersection portion of one source line and one gate line. The pixel includes one or more display elements and two or more transistors. The pixel includes a pixel electrode functioning as an electrode of the display element.

The pixel includes a first transistor and a second transistor. In this case, the second transistor preferably includes a plurality of transistors sharing the gate (also referred to as a subtransistor). For example, the second transistor includes a plurality of subtransistors connected in series. Alternatively, the second transistor includes a plurality of subtransistors connected in parallel. Alternatively, the second transistor has a structure in which groups of subtransistors connected in parallel are connected in series (also referred to as series-parallel connection)

Here, the subtransistor refers to one of the group of transistors sharing the gate and being connected in series or in parallel. In the case where the plurality of subtransistors are connected in parallel, the gate, the source, and the drain are shared between each subtransistor. In the case where the plurality of subtransistors are connected in series, the gate is shared between each subtransistor, and two adjacent subtransistors are connected so that the source of one subtransistor and the drain of the other subtransistor are shared. Note that in the following description, a subtransistor may be simply referred to as a transistor in some cases.

It is preferable that the subtransistors included in the second transistor have substantially the same channel length and channel width. That is, the second transistor preferably includes the plurality of subtransistors with the same designed value that are connected in series, in parallel, or in series-parallel. Thus, compared to the case where the second transistor includes one transistor, a variation in electrical characteristics of the second transistor among the pixels is reduced.

In addition, all subtransistors included in the second transistor preferably have the same channel length direction. For example, it is preferable that each subtransistor be arranged so that the channel length direction of all the transistors is parallel to the first direction or the second direction. At this time, it is preferable that all subtransistors also have the same channel width direction.

The channel formation regions of the plurality of subtransistors are preferably arranged at regular intervals. Note that the channel formation region here means part of a semiconductor layer of a transistor and a region overlapping with the gate in a plan view.

It is preferable that the first transistor and one of the subtransistors have substantially the same channel length and channel width. Furthermore, they preferably have the same channel length direction and channel width direction. In particular, it is preferable that all transistors included in the pixel include subtransistors designed to have the same size.

The channel length direction of the first transistor is preferably parallel to the first direction or the second direction. In this case, the channel length direction of the subtransistor is preferably parallel to the channel length direction of the first transistor. In this manner, the plurality of transistors included in the pixel preferably have the same direction of current flow so that the designing can be facilitated.

More specific examples are described below with reference to drawings.

Structure Example

Figure 1B:
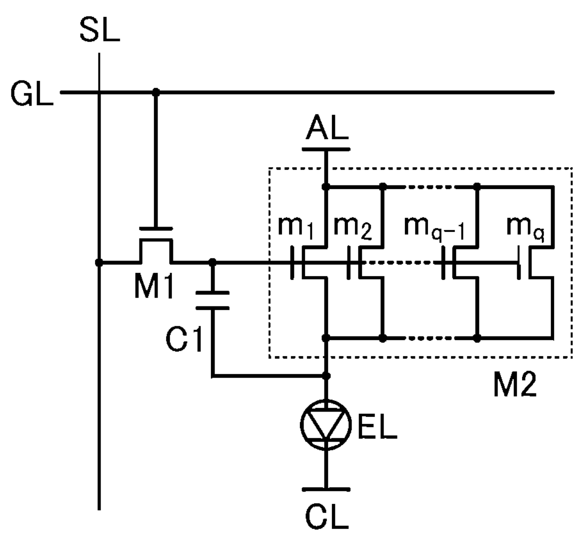
Figure 1C:
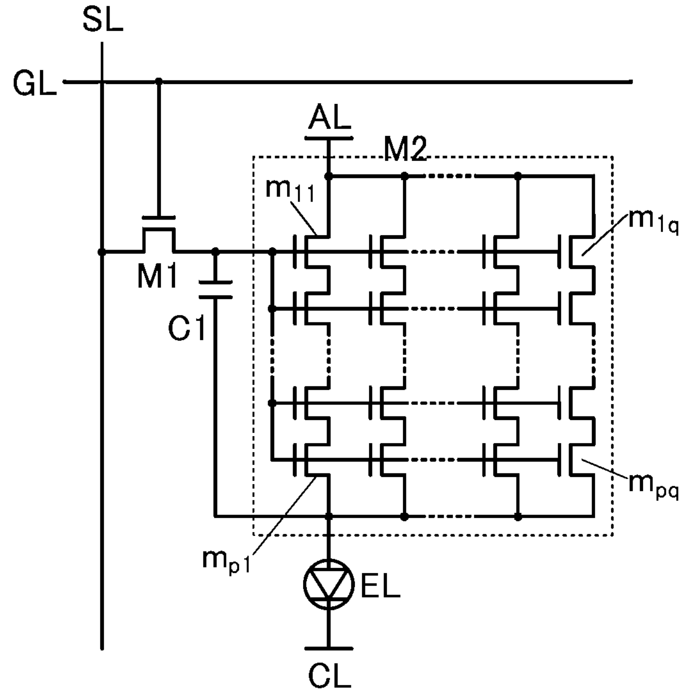

FIG. 1A, FIG. 1B, and FIG. 1C illustrate examples of pixel circuits of the display apparatus of one embodiment of the present invention.

The pixel circuits illustrated in FIG. 1A, FIG. 1B, and FIG. 1C include a transistor M1, a transistor M2, a capacitor C1, and a light-emitting element EL. A wiring GL, a wiring SL, a wiring AL, and a wiring CL are electrically connected to the pixel circuit.

Agate signal is supplied to the wiring GL. A source signal is supplied to the wiring SL. A constant potential is supplied to each of the wiring AL and the wiring CL. In the light-emitting element EL, an anode side can have a high potential and a cathode side can have a lower potential than the anode side.

The transistor M1 can be referred to as a selection transistor and functions as a switch for controlling selection/non-selection of the pixel. A gate of the transistor M1 is electrically connected to the wiring GL, one of a source and a drain of the transistor M1 is electrically connected to the wiring SL, and the other of the source and the drain of the transistor M1 is electrically connected to one electrode of the capacitor C1 and the transistor M2.

The capacitor C1 functions as a storage capacitor. The other electrode of the capacitor C1 is electrically connected to one electrode of the light-emitting element EL. Note that the capacitor C1 is not necessarily provided when not needed.

The transistor M2 can be referred to as a driver transistor and has a function of controlling current flowing to the light-emitting element EL.

The transistor M2 includes a plurality of transistors (sub-transistors).

In FIG. 1A, the transistor M2 includes p (p is an integer greater than or equal to 2) transistors $m_i$ (i is an integer greater than or equal to 1 and less than or equal top) connected in series. Gates of the transistors $m_i$ are electrically connected to each other (in other words, the gates are shared).

Among the transistor $m_i$ to the transistor $m_p$, one of a source and a drain of the transistor $m_1$ is electrically connected to the wiring AL and the other of the transistor $m_1$ is electrically connected to one of a source and a drain of a transistor $m_2$. One of a source and a drain of the transistor $m_p$ is electrically connected to the other of a source and a drain of a transistor $m_{p-1}$, and the other of the source and the drain of the transistor $m_p$ is electrically connected to one electrode of the light-emitting element EL and the other electrode of the capacitor C1. One of a source and a drain of each of the transistors $m_j$ other than the transistor $m_1$ and the transistor $m_p$ (the transistor $m_2$ to the transistor $m_{p-1}$) is electrically connected to the other of a source and a drain of a transistor $m_{i-1}$, and the other of the source and the drain of each of the transistors $m_i$ is electrically connected to one of a source and a drain of a transistor $m_{i+1}$.

FIG. 1B illustrates a structure in which the transistor M2 includes q (q is an integer greater than or equal to 2) transistors $m_j$ (j is an integer greater than or equal to 1 and less than or equal to q) connected in parallel. Gates, sources, and drains of the transistors $m_j$ are shared.

Gates of each of the transistor $m_1$ to the transistor $m_q$ are electrically connected to the other of a source and a drain of the transistor M1. One of a source and a drain of each of the transistor $m_1$ to the transistor $m_q$ is electrically connected to the wiring AL, and the other is electrically connected to one electrode of the light-emitting element EL.

FIG. 1C illustrates an example in which the transistor M2 includes p×q transistors $m_{ij}$. Specifically, q units each including p transistors connected in series are connected in parallel.

In the structures illustrated in FIG. 1A, FIG. 1B, and FIG. 1C, it is preferable that the transistors $m_i$, the transistors $m_j$, or the transistors $m_{ij}$ (in the following description, they are referred to as transistors m when not distinguished) included in the transistor M2 preferably have the same transistor structure and substantially the same channel length and channel width.

For example, the channel length and the channel width of each of the transistors m are denoted by L and W, respectively. In this case, the transistor M2 in FIG. 1A can be regarded as one transistor having a channel length of p×L and a channel width of W. In addition, the transistor M2 in FIG. 1B can be regarded as one transistor having a channel length of L and a channel width of q×W. In addition, the transistor M2 in FIG. 1C can be regarded as one transistor having a channel length of p×L and a channel width of q×W.

Next, an example of a pixel circuit which is different from the above is described. Note that in the following description, the transistor M2 having the structure illustrated in FIG. 1A, which includes a plurality of transistors connected in series, is used; however, the transistor M2 illustrated in FIG. 1B and FIG. 1C can also be used.

A pixel circuit illustrated in FIG. 2A has a structure in which a transistor M3 is added to the structure in FIG. 1A. In addition, a wiring V0 is electrically connected to the pixel circuit in FIG. 2A.

A gate of the transistor M3 is electrically connected to the wiring GL, one of a source and a drain of the transistor M3 is electrically connected to an anode of the light-emitting element EL, and the other of the source and the drain of the transistor M3 is electrically connected to the wiring V0.

The wiring V0 is supplied with a constant potential when data is written to the pixel circuit. Thus, a variation in the gate-source voltage of the transistor M2 can be inhibited.

A pixel circuit illustrated in FIG. 2B is an example of the case where a transistor including a pair of gates is used as each transistor $m_j$ included in the transistor M1 and the transistor M2 in the pixel circuit in FIG. 1A.

A pair of gates of the transistor M1 is electrically connected to each other. Thus, current that can flow through the transistor can be increased. In addition, a back gate of each of the transistor $m_1$ to a transistor $m_n$ included in the transistor M2 is electrically connected to the other of a source and a drain of the transistor $m_n$. For example, when the wiring AL is supplied with a potential higher than a potential supplied to the wiring CL, the source of the transistor $m_n$ is electrically connected to the back gate of each transistor. Thus, the transistor M2 can have stable electrical characteristics and increased reliability.

FIG. 2C illustrates an example of the case where a transistor including a pair of gates is used as each transistor of the pixel circuit in FIG. 2A.

FIG. 2D and FIG. 2E show different examples of the transistor M2. As illustrated in FIG. 2D, back gates of the transistor $m_i$ to the transistor $m_n$ may be electrically connected to their own sources. Alternatively, as illustrated in FIG. 2E, the back gate and the gate of each of the transistor $m_1$ to the transistor $m_n$ may be electrically connected to each other.

Figure 3A:
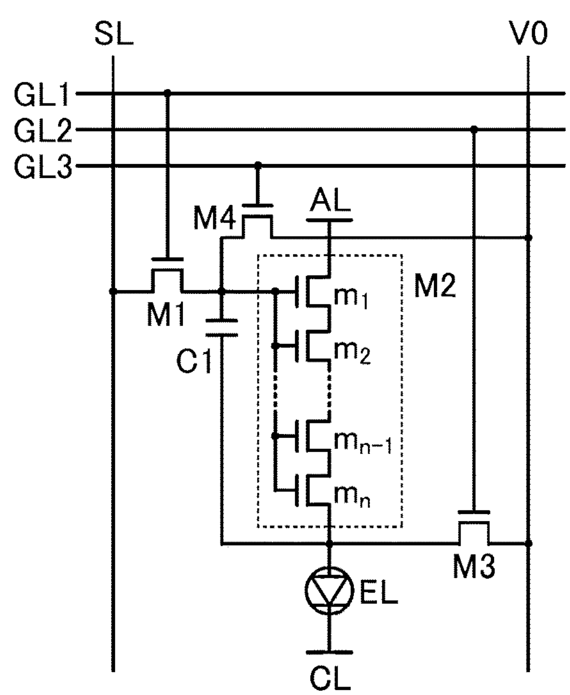
FIG. 3A to FIG. 3D are diagrams illustrating configuration examples of a pixel circuit.

FIG. 3A illustrates a structure in which a transistor M4 is added to the structure illustrated in FIG. 2A. Three wirings (a wiring GL1, a wiring GL2, and a wiring GL3) functioning as gate lines are electrically connected in FIG. 3A.

A gate of the transistor M4 is electrically connected to the wiring GL3, one of a source and a drain of the transistor M4 is electrically connected to a gate of the transistor M2, and the other of the source and the drain of the transistor M4 is electrically connected to the wiring V0. The gate of the transistor M1 is electrically connected to the wiring GL1, and the gate of the transistor M3 is electrically connected to the wiring GL2.

When the transistor M3 and the transistor M4 are turned on in the same period, a source and the gate of the transistor M2 have the same potential, so that the transistor M2 can be turned off. Thus, current flowing to the light-emitting element EL can be blocked forcibly. Such a pixel circuit is suitable for the case of using a display method in which a display period and an non-lighting period are alternately provided.

Figure 3B:
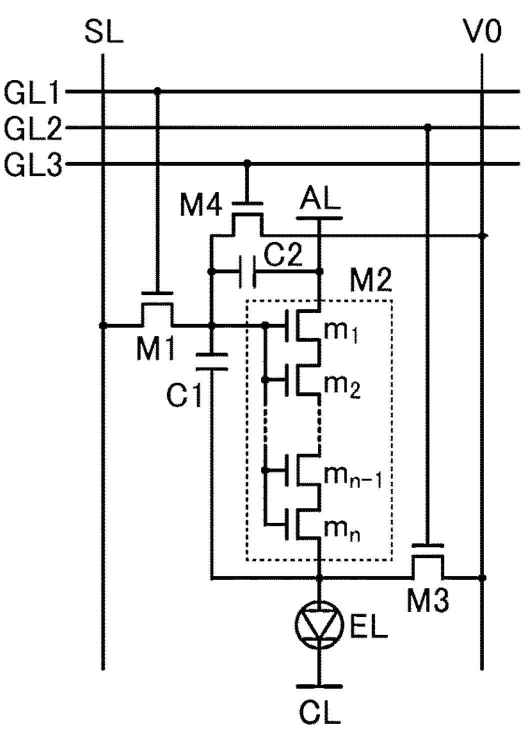

FIG. 3B illustrates an example of a pixel circuit in which a capacitor C2 is added to FIG. 3A. The capacitor C2 functions as a storage capacitor.

Figure 3C:
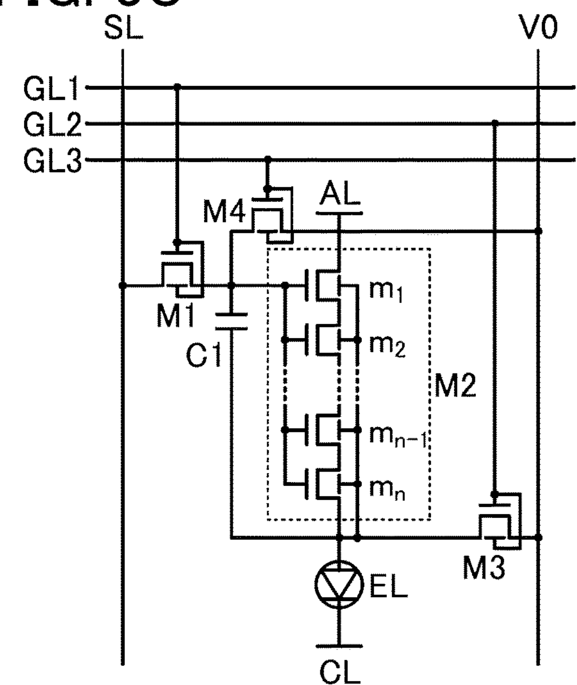
Figure 3D:
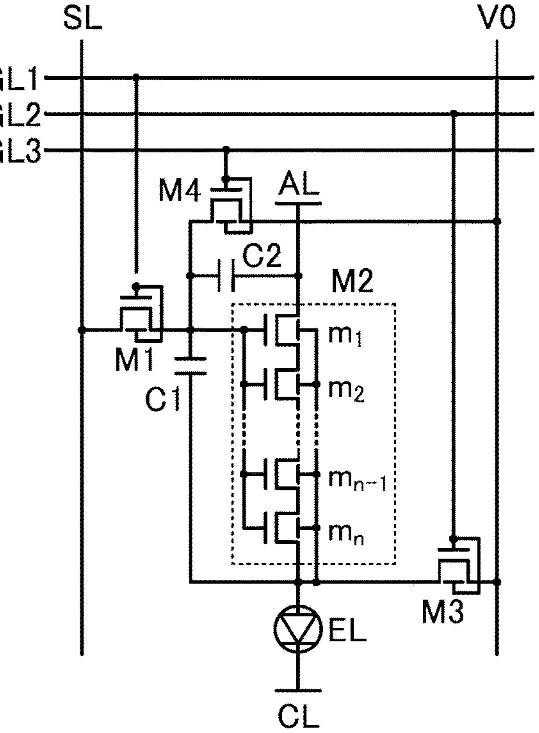

FIG. 3C and FIG. 3D illustrate examples of pixel circuits in which a transistor including a pair of gates is used in FIG. 3A and FIG. 3B. A transistor including a pair of gates electrically connected to each other is used as each of the transistor M1, the transistor M3, and the transistor M4, and a transistor whose source is electrically connected to one of the gates is used as the transistor M2.

Driving Method Example

An example of a method for driving a display apparatus in which the pixel circuit illustrated in FIG. 3A is used will be described below. Note that a similar driving method can also be applied to the pixel circuits in FIG. 3B, FIG. 3C, and FIG. 3D.

Figure 4:
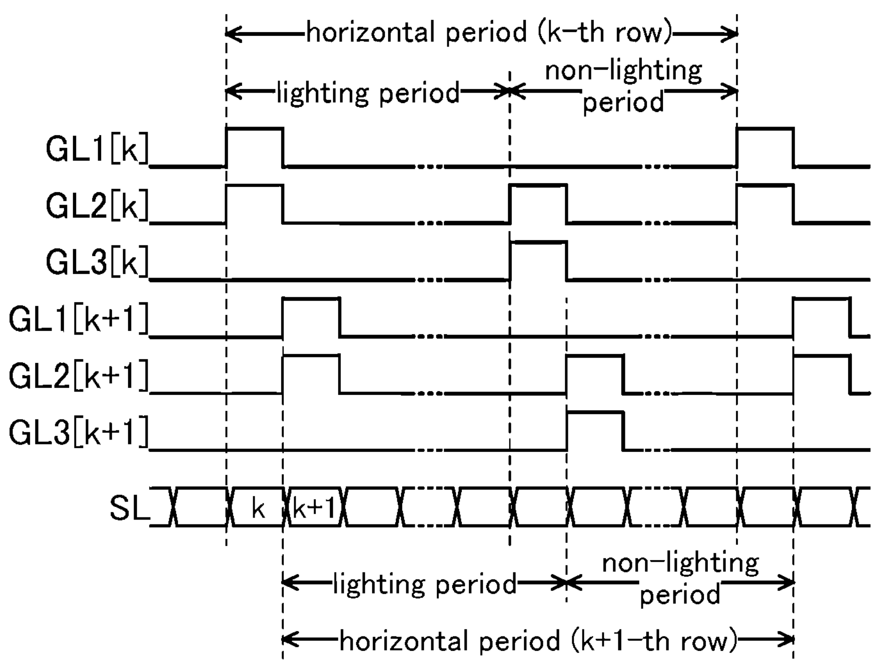
FIG. 4 is a timing chart showing an operation method example of a display apparatus.

FIG. 4 shows a timing chart of the driving method for the display apparatus. Shown here are changes in potentials of a wiring GL1[*k*], a wiring GL2[*k*], and a wiring GL3[*k*] that are gate lines of the k-th row and changes in the potentials of a wiring GL1[*k*+1], a wiring GL2[*k*+1], and a wiring GL3[*k*+1] that are gate lines of the k+1-th row. FIG. 4 also shows the timing of supplying a signal to the wiring SL functioning as a source line.

Here, an example of the driving method in which one horizontal period is divided into a lighting period and a non-lighting period is shown. A horizontal period of the k-th row is shifted from a horizontal period of the k+1-th row by a selection period of the gate line.

In a lighting period of the k-th row, first, the wirings GL1[*k*] and the wiring GL2[*k*] are supplied with a high-level potential and the wiring SL is supplied with a source signal. Thus, the transistor M1 and the transistor M3 are turned on, so that a potential corresponding to the source signal is written from the wiring SL to the gate of the transistor M2. After that, the wiring GL1[*k*] and the wiring GL2[*k*] are supplied with a low-level potential, so that the transistor M1 and the transistor M3 are turned off and the gate potential of the transistor M2 is retained.

Subsequently, in a lighting period of the k+1-th row, data is written by operation similar to that described above.

Next, the non-lighting period is described. In the non-lighting period of the k-th row, the wiring GL2[*k*] and the wiring GL3[*k*] are supplied with the high-level potential. Accordingly, the transistor M3 and the transistor M4 are turned on, and the source and the gate of the transistor M2 are supplied with the same potential, so that almost no current flows through the transistor M2. Therefore, the light-emitting element EL is turned off. All the subpixels positioned in the k-th row are turned off. The subpixels of the k-th row remain in the off state until the next lighting period.

Subsequently, in the non-lighting period of the k+1-th row, all the subpixels of the k+1-th row are turned off in a manner similar to that described above.

Such a driving method described above, in which the subpixels are not constantly on through one horizontal period and a non-lighting period is provided in one horizontal period, can be called duty driving. With duty driving, an afterimage phenomenon can be inhibited at the time of displaying moving images; therefore, a display apparatus with high performance in displaying moving images can be achieved. Particularly in a VR device and the like, a reduction in an afterimage can reduce what is called VR sickness.

In the duty driving, the proportion of the lighting period in one horizontal period can be called a duty cycle. For example, a duty cycle of 50% means that the lighting period and the non-lighting period have the same lengths. Note that the duty cycle can be set freely and can be adjusted appropriately within a range higher than 0% and lower than or equal to 100%, for example.

The above is the description of the driving method example.

[Structure Example of Transistor]

Next, a structure example of a transistor that can be used for a pixel of the display apparatus of one embodiment of the present invention will be described.

Figure 5:
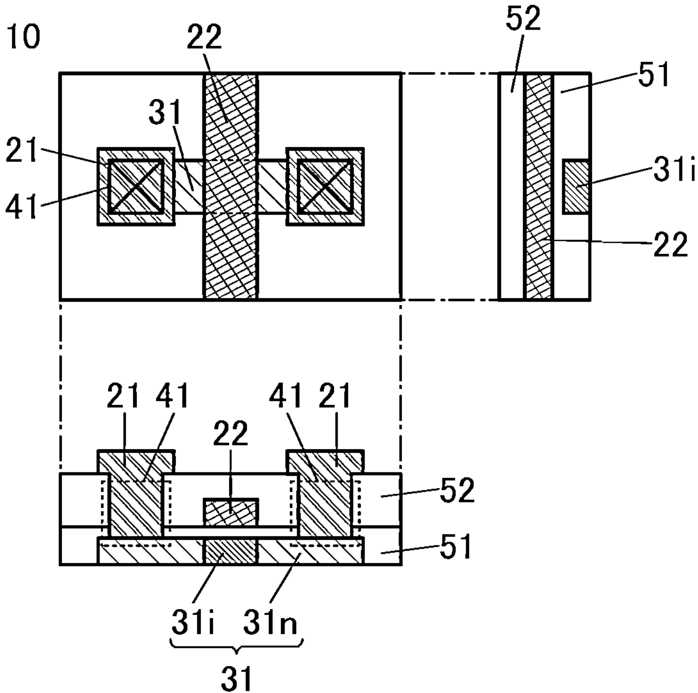
FIG. 5 is a diagram illustrating a structure example of a transistor.

FIG. 5 illustrates a schematic top view and a schematic cross-sectional view of a transistor 10. The transistor 10 includes a semiconductor layer 31, conductive layers 21, a conductive layer 22, an insulating layer 51, an insulating layer 52, and the like.

The semiconductor layer 31 includes a region 31*i* functioning as a channel formation region and a pair of regions 31*n* which interposes the region 31*i* and functions as low-residence regions. One of the pair of regions 31*n* functions as a source and the other thereof functions as a drain. The insulating layer 51 is provided to cover the semiconductor layer 31 and part of the insulating layer 51 functions as a gate insulating layer. The conductive layer 22 is provided over the insulating layer 51 and part of the conductive layer 22 functions as a gate electrode. The conductive layer 22 includes a portion overlapping with the region 31*i* of the semiconductor layer 31. The insulating layer 52 functions as an interlayer insulating layer and is provided to cover the insulating layer 51 and the conductive layer 22. The pair of conductive layers 21 is provided over the insulating layer 52. In contact portions 41, the conductive layers 21 are electrically connected to the region 31*i* through opening portions provided in the insulating layer 52 and the insulating layer 51. Part of the conductive layer 21 serves as a source electrode or a drain electrode.

The semiconductor layer 31 preferably includes a metal oxide (oxide semiconductor) having a wider band gap than that of silicon. Therefore, a transistor with low off-state current can be obtained. In particular, the semiconductor layer 31 preferably includes a metal oxide containing one or both of indium and zinc.

Alternatively, the semiconductor layer 31 may contain silicon. Examples of silicon include amorphous silicon and crystalline silicon (e.g., low-temperature polysilicon or single crystal silicon).

Although the transistor 10 illustrated in FIG. 5 is what is called a top-gate transistor, in which the gate electrode is provided over the semiconductor layer 31, the structure of the transistor is not limited thereto, and variety of structures can be used. For example, a bottom-gate transistor or a dual-gate transistor can be used in the display apparatus.

Examples of transistors, pixel circuits, and the like described below are formed by combination with the transistor 10 in FIG. 5 used as a basic structure. Note that the same reference numerals are given to the structure formed in the same step on the same plane in the description unless otherwise specified. For example, a conductive layer part of which functions as a gate electrode and a conductive layer which is formed in the same processes as the conductive layer and functions as a wiring are denoted by the same reference numerals.

Figure 6A:
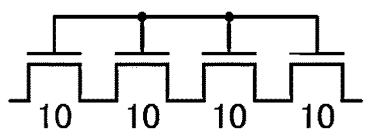
FIG. 6A to FIG. 6E are diagrams illustrating structure examples of transistors.

FIG. 6A illustrates a circuit diagram of a transistor 10*a* and a transistor 10*b* described below. The transistor 10*a* and the transistor 10*b* each include four transistors 10 which are connected in series and share the gates. Each of the transistors 10 includes a channel formation region in the island-shaped semiconductor layer 31.

Figure 6B:
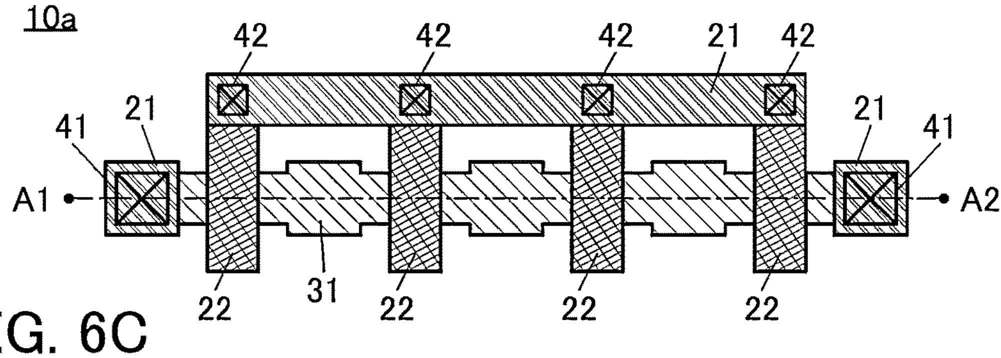
Figure 6C:
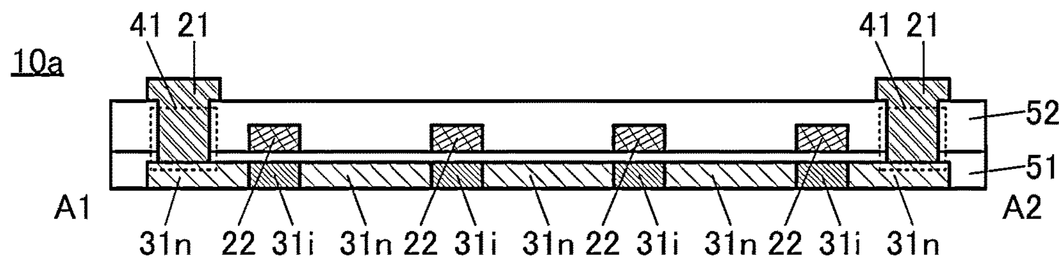

FIG. 6B illustrates an example of a schematic top view of the transistor 10*a*. FIG. 6C illustrates a schematic cross-sectional view taken along the cutting line A1-A2 in FIG. 6A. In the transistor 10*a*, four conductive layers 22 functioning as gate electrodes are provided at regular intervals over the island-shaped semiconductor layer 31 with an insulating layer 51 therebetween.

The four conductive layers 22 are electrically connected to each other through the conductive layers 21. The conductive layers 22 and the conductive layers 21 are electrically connected to each other in contact portions 42. Thus, the four transistors connected in series are constructed. Although an example where the four conductive layers 22 are connected to each other through the conductive layers 21 here, one conductive layer 22 having a comb-like top surface may be used.

In both end portions of the semiconductor layer 31 in a longitudinal direction, the pair of conductive layers 21 electrically connected to the regions 31*n* is provided. Note that the conductive layer 21 may also be provided in a region between two adjacent conductive layers 22.

Figure 6D:
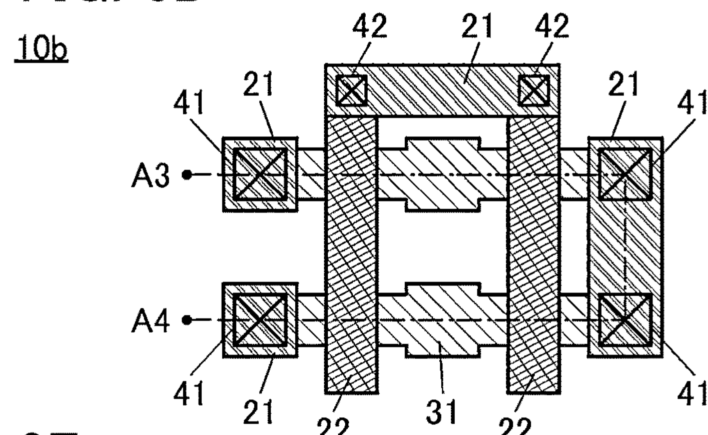
Figure 6E:
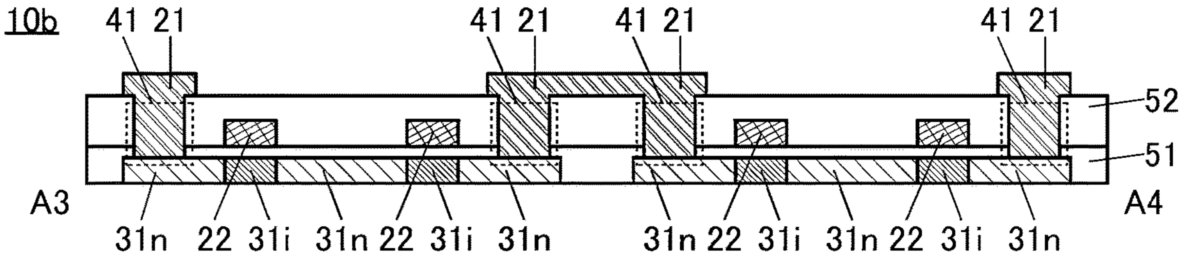

FIG. 6D is a schematic top view of the transistor 10*b*. FIG. 6E illustrates a schematic cross-sectional view taken along the cutting line A3-A4 in FIG. 6D. The transistor 10*b* has a structure in which two semiconductor layers 31 arranged symmetrically (here, vertically symmetrically) with interval are connected to each other through the conductive layers 21. In addition, two conductive layers 22 arranged symmetrically (here, bilaterally symmetrically) with interval are arranged to intersect with two semiconductor layers 31. Such a structure can reduce the occupied area.

Figures 7A, 7B, 7C:
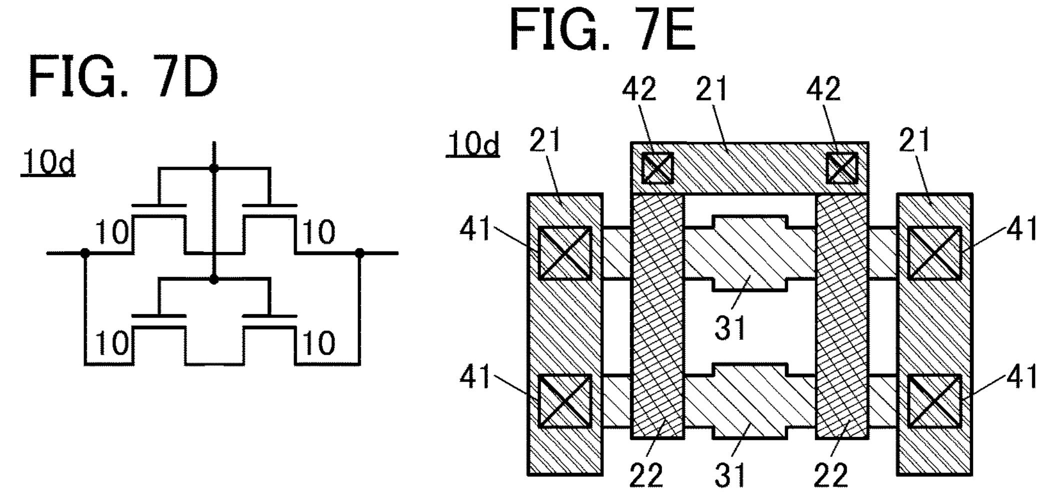

FIG. 7A illustrates a circuit diagram of a transistor 10*c*. The transistor 10*c* includes four transistors 10 connected in parallel and sharing a gate, a source, and a drain.

FIG. 7B illustrates an example of a schematic top view of the transistor 10*c*. FIG. 7C illustrates a schematic cross-sectional view taken along the cutting line A5-A6 in FIG. 7B. The transistor 10*c* includes the conductive layer 22 provided to intersect with four island-shaped semiconductor layers 31 arranged at regular intervals. In addition, the conductive layers 21 are connected to both ends of the four island-shaped semiconductor layers 31.

FIG. 7D illustrates a circuit diagram of a transistor 10*d*. The transistor 10*d* includes four transistors sharing gates. Every two of the four transistors are connected in series.

FIG. 7E illustrates an example of a schematic top view of the transistor 10*d*. The transistor 10*d* has a structure similar to that illustrated in FIG. 6D except the shape of the conductive layers 21. Two semiconductor layers 31 include the pair of conductive layers 21 connected to their both end portions. The pair of conductive layers 21 each electrically connects the two semiconductor layers to each other.

Although the transistor 10*a* to the transistor 10*d* each show an example of including the four transistors 10, the structure is not limited thereto, and may include two, three, five or more transistors 10.

[Example of Layout Methods]

Layout examples of the case where the transistors with substantially the same channel length and channel width are combined will be described below.

Figure 8A:
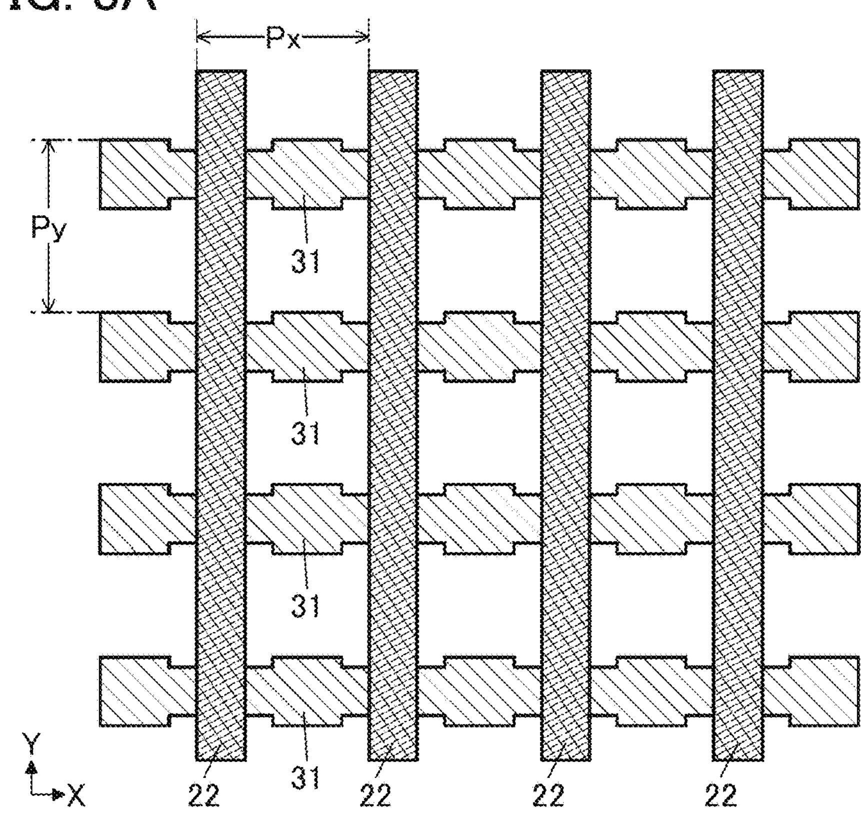
FIG. 8A and FIG. 8B are diagrams illustrating structure examples of transistors.

FIG. 8A illustrates a basic structure. In FIG. 8A, the plurality of semiconductor layers 31 whose longitudinal direction is parallel to the X direction are arranged at regular intervals in the Y direction. Furthermore, the conductive layers 22 whose longitudinal direction is parallel to the Y direction are arranged at regular intervals in the X direction. A portion where the conductive layer 22 and the semiconductor layer 31 intersect with each other is a channel formation region (region 31*i*) of a transistor.

Here, an interval of the semiconductor layers 31 arranged in the Y direction is referred to as Py. An interval of the conductive layers 22 arranged in the X direction is referred to as Px.

As illustrated in FIG. 8A, the semiconductor layer 31 is preferably processed so that the width in the Y direction of a region between two conductive layers 22 is larger than the width of a region overlapping with the conductive layers 22. Thus, since the area of the contact portions 41 of the semiconductor layer 31 and the conductive layer 21 can be large, resistance between them (also referred to as a contact resistance) can be reduced.

With the layout illustrated in FIG. 8A used as a basic structure, transistors with various sizes or various circuits can be formed by combination of the transistors 10 having substantially the same channel length and channel width in the following manner, for example: the semiconductor layer 31 extending in the X direction is divided; the conductive layer 22 extending in the Y direction is divided; and the semiconductor layers 31, the conductive layers 22, or the semiconductor layer 31 and the conductive layer 22 are connected to each other through the conductive layer 21.

Figure 8B:
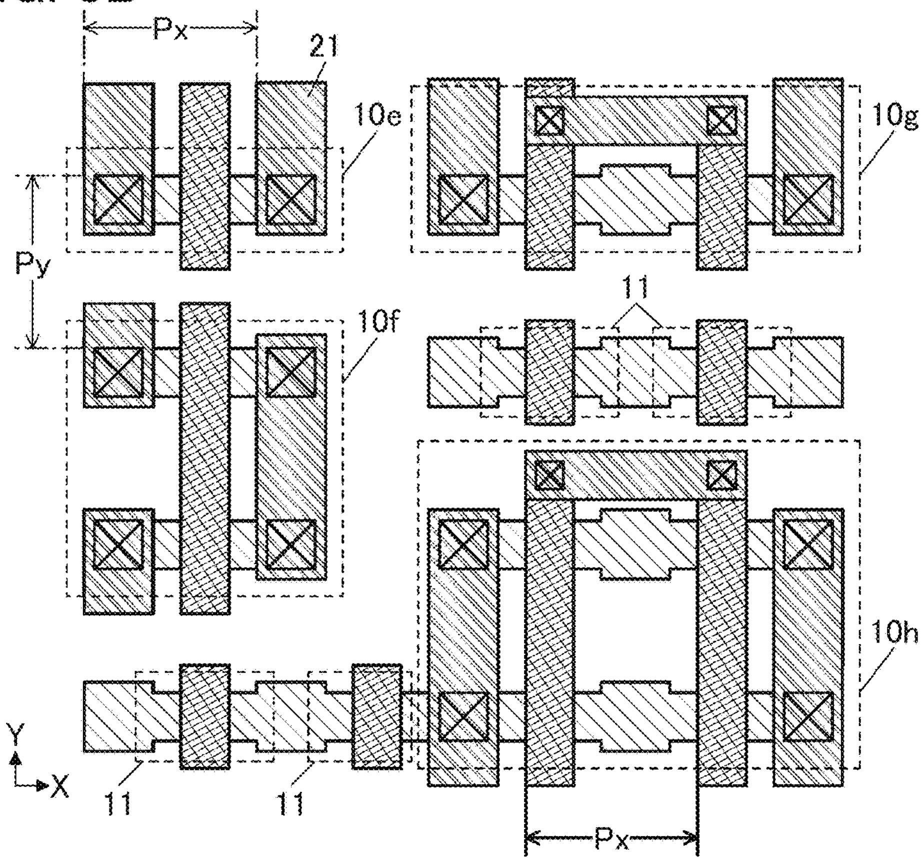

FIG. 8B illustrates application examples of the layout in FIG. 8A. FIG. 8B illustrates a transistor 10*e*, a transistor 10*f*, a transistor 10*g*, a transistor 10*h*, and the like.

The transistor 10*e* is a single transistor. The transistor 10*f* and the transistor 10*g* each include two transistors connected in series. The transistor 10*h* has a structure in which two of four transistors are connected in parallel and two of four transistors are connected in series as the transistor 10*e* illustrated in FIG. 7E.

In FIG. 8B, the plurality of conductive layers 21 are illustrated. As illustrated in FIG. 8B, the conductive layers 21 are preferably arranged at regular intervals as much as possible. Thus, variations in processing shapes of the conductive layers 21 can be reduced. FIG. 8B illustrates examples in which the conductive layers 21 are arranged at an interval of Px, which is the same as the interval at which the conductive layer 22 are arranged.

A dummy layer may be provided in a portion where the transistor is not arranged. For example, the semiconductor layer 31, the conductive layer 22, or the conductive layers 21 that is electrically floating may be provided in a vacant space. Note that a dummy layer is a layer that is provided in a vacant space in order to stabilize a manufacturing process, to reduce a processing variation, and the like, and is basically not considered as a component of the circuit. For this reason, a dummy layer is electrically floating or supplied with a constant voltage. Note that a dummy layer is preferably provided for layers other than the semiconductor layer.

As illustrated in FIG. 8B, a plurality of dummy transistors 11 may be provided. A dummy transistor has a stacked-layer structure functioning as a transistor and is a transistor at least one of a gate, a drain, and a source of which is electrically floating.

In this manner, the dummy transistors 11 are arranged in a region where a transistor is not provided, so that variation in processing shapes of the semiconductor layer 31, the conductive layer 22, and the like can be reduced, and variations in electrical characteristics of transistors can be reduced.

Pixel Structure Example

A specific structure example of a pixel is described below.

Structure Example 1

Figure 9:
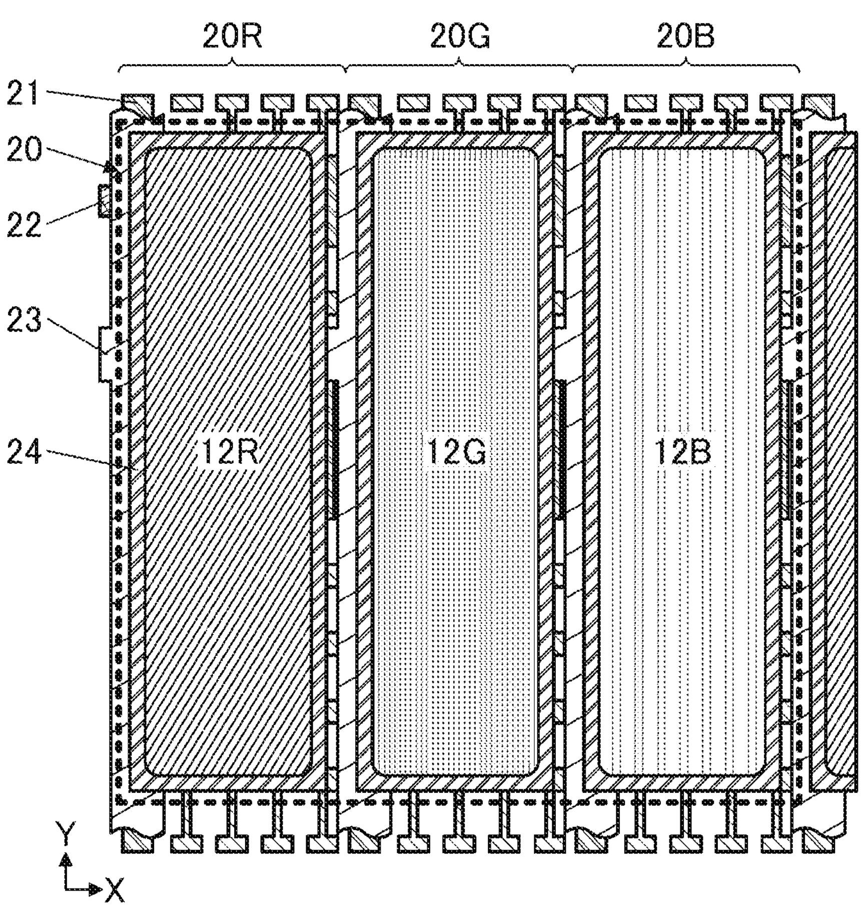
FIG. 9 is a diagram illustrating a structure example of a display apparatus.

FIG. 9 illustrates a schematic top view of a pixel 20 included in a display apparatus. The pixel 20 includes a subpixel 20R, a subpixel 20G, and a subpixel 20B. The display apparatus includes the plurality of pixels 20 that are arranged periodically in the X direction and the Y direction.

The subpixel 20R includes a light-emitting element 12R emitting red light. The subpixel 20G includes a light-emitting element 12G emitting green light. The subpixel 20B includes a light-emitting element 12B emitting blue light.

The light-emitting element 12R, the light-emitting element 12G, and the light-emitting element 12B may contain different light-emitting materials from each other, may each have a structure with a combination of a white light-emitting element and a color filter, or may each have a structure with a combination of a blue or violet light-emitting element and a color conversion material (e.g., a quantum dot).

FIG. 10A to FIG. 10E each illustrate a schematic top view of a subpixel 20X, one of the subpixels included in the pixel 20 illustrated in FIG. 9. The subpixel 20X can be used as the subpixel 20R, the subpixel 20G, and the subpixel 20B. Note that the light-emitting element is omitted here.

Figures 10A, 10B, 10C, 10D, 10E:
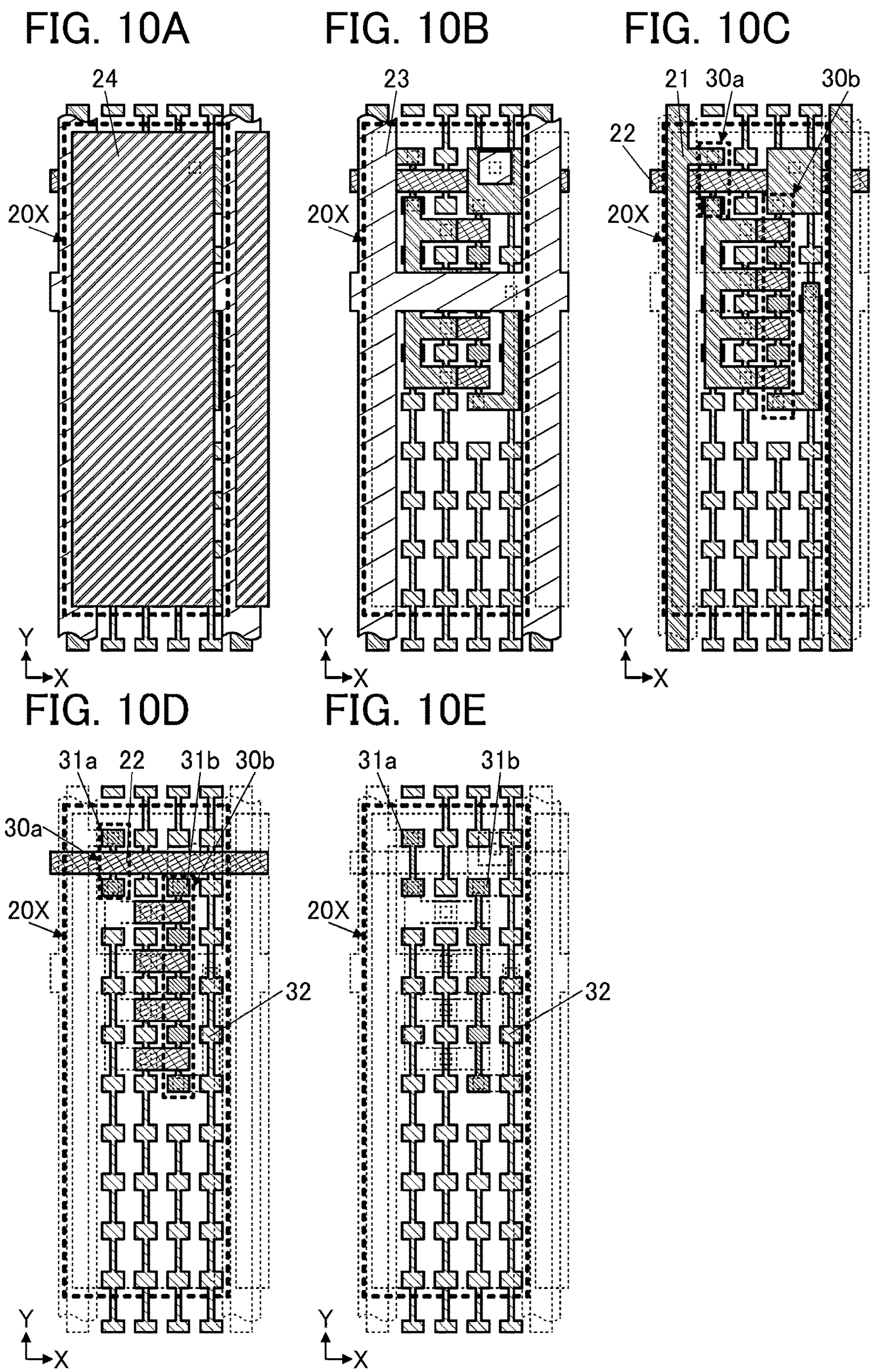
FIG. 10A to FIG. 10E are diagrams illustrating structure examples of a display apparatus.

In FIG. 10B, only the outline of a pixel electrode 24 illustrated in FIG. 10A is clearly indicated by a dashed line, and FIG. 10B illustrates an example of a top surface shape of the conductive layer 23.

A wiring formed by the conductive layer 23 functions as a power supply line for the light-emitting element 12R and the like, and is supplied with a constant potential. In the case where the pixel electrode 24 functions as an anode, the wiring is supplied with a high power supply potential; in the case where the pixel electrode 24 functions as a cathode, the wiring is supplied with a low power supply potential.

As illustrated in FIG. 10B, it is preferable that the conductive layer 23 functioning as the wiring include not only a portion extending in the Y direction but also a portion extending in the X direction. Thus, the conductive layer 23 can have a lattice-shaped top surface, so that the influence of a voltage drop can be inhibited compared with the case where the layer has a stripe-shaped top surface.

In FIG. 10C, only the outline of the conductive layer 23 illustrated in FIG. 10B is clearly indicated by a dashed line. In FIG. 10D, only the outline of the conductive layers 21 illustrated in FIG. 10C is clearly indicated by a dashed line. In FIG. 10E, only the outline of the conductive layer 22 illustrated in FIG. 10D is clearly indicated by a dashed line.

FIG. 10C and FIG. 10D illustrate a transistor 30*a* and a transistor 30*b*. FIG. 10D also illustrates a semiconductor layer 31*a* included in the transistor 30*a* and a semiconductor layer 31*b* included in the transistor 30*b*. The transistor 30*a* functions as a selection transistor for controlling selection/non-selection of the subpixel. The transistor 30*b* functions as a driving transistor that controls a current flowing to the light-emitting element.

Part of a gate of the transistor 30*a* is composed of the conductive layer 22 functioning as a gate line, one of a source and a drain of the transistor 30*a* is electrically connected to the conductive layer 21 functioning as a source line, and the other is electrically connected to a gate of the transistor 30*b*. One of a source and a drain of the transistor 30*b* is electrically connected to the conductive layer 23, and the other is electrically connected to the pixel electrode 24.

Here, the transistor 30*b* includes four transistors connected in series and sharing the gate. The transistor 30*b* can be regarded as one transistor whose channel length is four times as long as that of the transistor 30*a* and channel width is equal to that of the transistor 30*a*. The transistor 30*b* includes four channel formation regions in one island-shaped semiconductor layer 31*b*.

In the example described here, each top surface shape of the semiconductor layer 31*a* and the semiconductor layer 31*b* includes a pair of thick portions where contact portions are provided and a thin portion formed as a channel.

In the subpixel 20X, the semiconductor layer 31*a* included in the transistor 30*a* and the semiconductor layer 31*b* included in the transistor 30*b* are each placed so that current flows in the Y direction, i.e., a direction parallel to the direction in which the conductive layer 21 functioning as the source line extends. In other words, the transistor 30*a* and the transistor 30*b* are each placed so that the channel length direction thereof can be parallel to the Y direction and the channel width direction thereof can be parallel to the X direction. In this manner, the direction of current flow is preferably the same between the plurality of transistors included in the pixel, in which case designing can be facilitated.

Here, as illustrated in FIG. 10D and the like, a plurality of dummy layers 32 is preferably provided. The dummy layers 32 are formed by processing the same film as the semiconductor layer 31*a* and the semiconductor layer 31*b*, and can be films having the same composition as the semiconductor layer 31*a* and the semiconductor layer 31*b*. In FIG. 10A to FIG. 10E, different hatching patterns are used for the semiconductor layer 31*a* and 31*b* and the dummy layers 32 in order to distinguish the semiconductor layer 31*a* and the semiconductor layer 31*b* from the dummy layers 32.

A top surface of the dummy layers 32 preferably has the same shape as the top surface shape of the semiconductor layer 31*a* and the semiconductor layer 31*b*, or a shape in which the shapes of the top surfaces of the semiconductor layer 31*a* and the semiconductor layer 31*b* are periodically combined. In the subpixel 20X, one of the dummy layers 32 has a top surface shape that includes two or more thick portions and a thin portion connecting the two thick portions in the Y direction. Every dummy layer 32 is arranged so that the longitudinal direction thereof can be parallel to the Y direction. Furthermore, each of the dummy layers 32 is arranged across a plurality of pixels lined in the Y direction.

In this manner, when the dummy layers 32 are provided in a region where neither the semiconductor layer 31*a* nor the semiconductor layer 31*b* is provided, variations in processing shapes of the semiconductor layer 31*a* and the semiconductor layer 31*b* can be reduced and variations in the electrical characteristics of the transistor 30*a* and the transistor 30*b* can be reduced.

The dummy layers 32 are preferably arranged as many as possible so as to be laid over the region where neither the semiconductor layer 31*a* nor the semiconductor layer 31*b* is provided. Although the subpixel 20X is an example in which the dummy layers 32 are provided in a region other than the region where the conductive layers 21 are provided, the dummy layers 32 may be provided to overlap with the conductive layer 21.

Although two transistors are provided in one subpixel in this example, one embodiment of the present invention is not limited thereto, and three or more transistors may be provided. In that case, it is preferable that semiconductor layers of all the transistors included in the subpixel have the same patterns and the directions of current flowing in the semiconductor layers be the same as one another.

Structure Example 2

A structure example whose structure is partly different from that of the above is described below with reference to drawings. Note that portions similar to those described above are not described below in some cases. In the drawings shown below, the same reference numerals and the same hatching patterns are used for components having the same function and description thereof is omitted in some cases.

Figure 11:
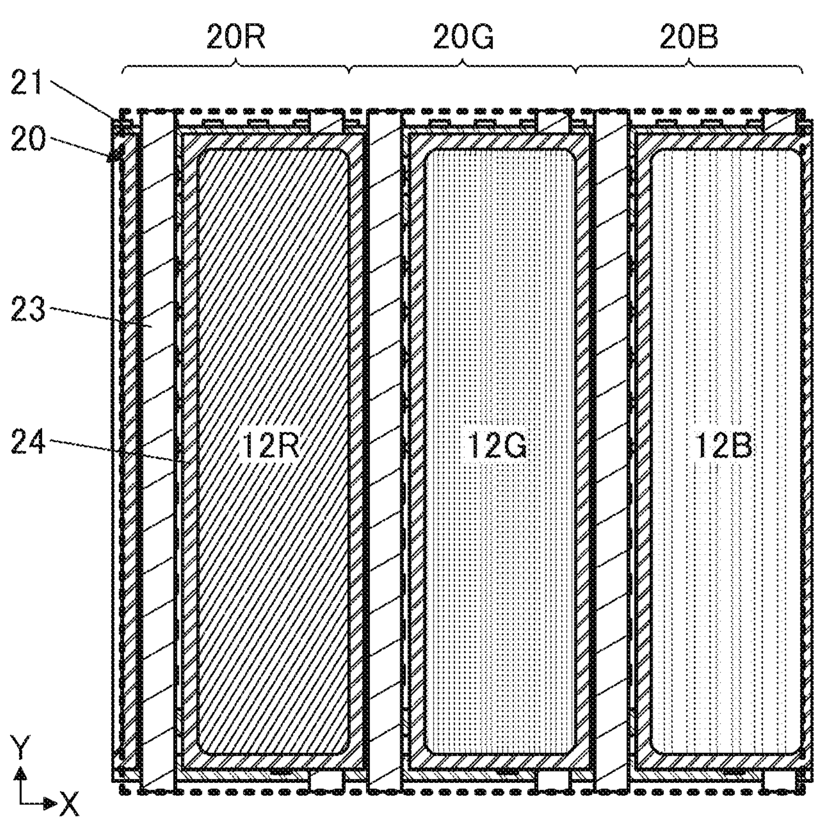
FIG. 11 is a diagram illustrating a structure example of a display apparatus.

FIG. 11 illustrates a schematic top view of a display apparatus described below as an example. In the display apparatus illustrated in FIG. 11, wirings extending in the Y direction such as a source line and a power source line are formed of the conductive layer 23, and a wiring extending in the X direction such as a gate line is formed of the conductive layer 21.

FIG. 12A to FIG. 12E illustrate schematic top views of the subpixel 20X. A display apparatus described below as an example is different from the display apparatus described in Structure example 1 above as an example in the direction of the semiconductor layer, in including four transistors, and the like. The subpixel 20X in FIG. 11 and FIG. 12A to FIG. 12E corresponds to the pixel circuit described in FIG. 3A as an example.

Figures 12A, 12B, 12C, 12D, 12E:
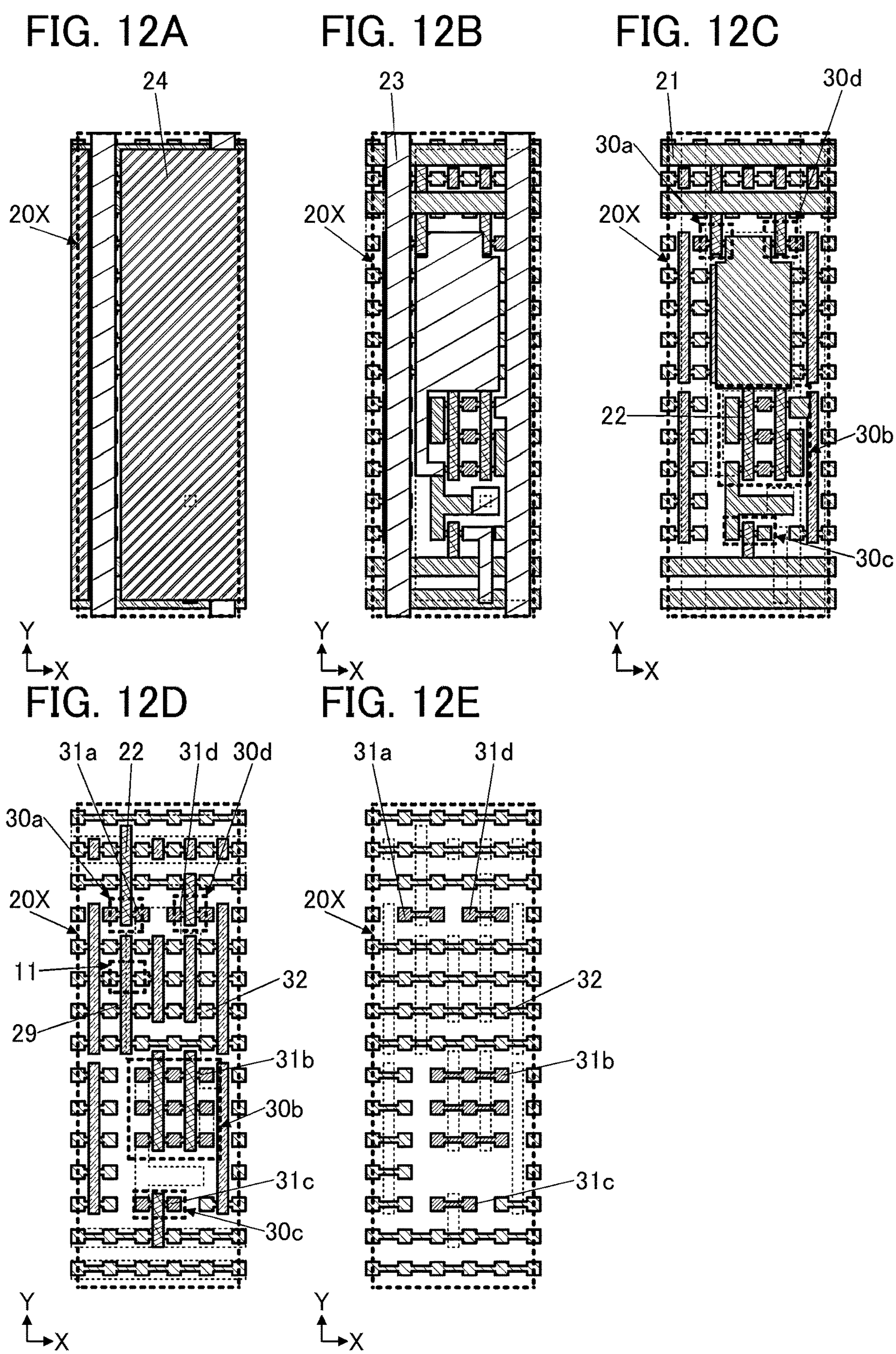
FIG. 12A to FIG. 12E are diagrams illustrating structure examples of a display apparatus.

As illustrated in FIG. 12C and FIG. 12D, the subpixel 20X includes the transistor 30*a*, the transistor 30*b*, a transistor 30*c*, and a transistor 30*d*. The transistor 30*a*, the transistor 30*c*, and the transistor 30*d* are each formed of one transistor. The transistor 30*b* has a structure in which six transistors are connected in series. In the transistor 30*b*, each of three semiconductor layers 31*b* arranged at regular intervals in the Y direction includes two channel formation regions.

The dummy layers 32 are arranged so that the longitudinal direction thereof is parallel to the X direction. The dummy layers 32 are arranged across a plurality of pixels lined in the X direction.

FIG. 12D and the like illustrate a dummy layer 29, which is formed in the same process as the conductive layer 22 and is electrically floating, with hatching pattern different from that of the conductive layer 22 so as to distinguish the dummy layer 29 from the conductive layer 22 functioning as a gate electrode, a wiring or the like.

The subpixel 20X includes the plurality of dummy transistors 11 including the dummy layers 32 and the dummy layer 29.

The above is the description of the structure examples of the pixels.

[Example of Cross-Sectional Structure]

Next, cross-sectional structure examples of the display apparatus of one embodiment of the present invention will be described.

Cross-Sectional Structure Example 1

Figure 13:
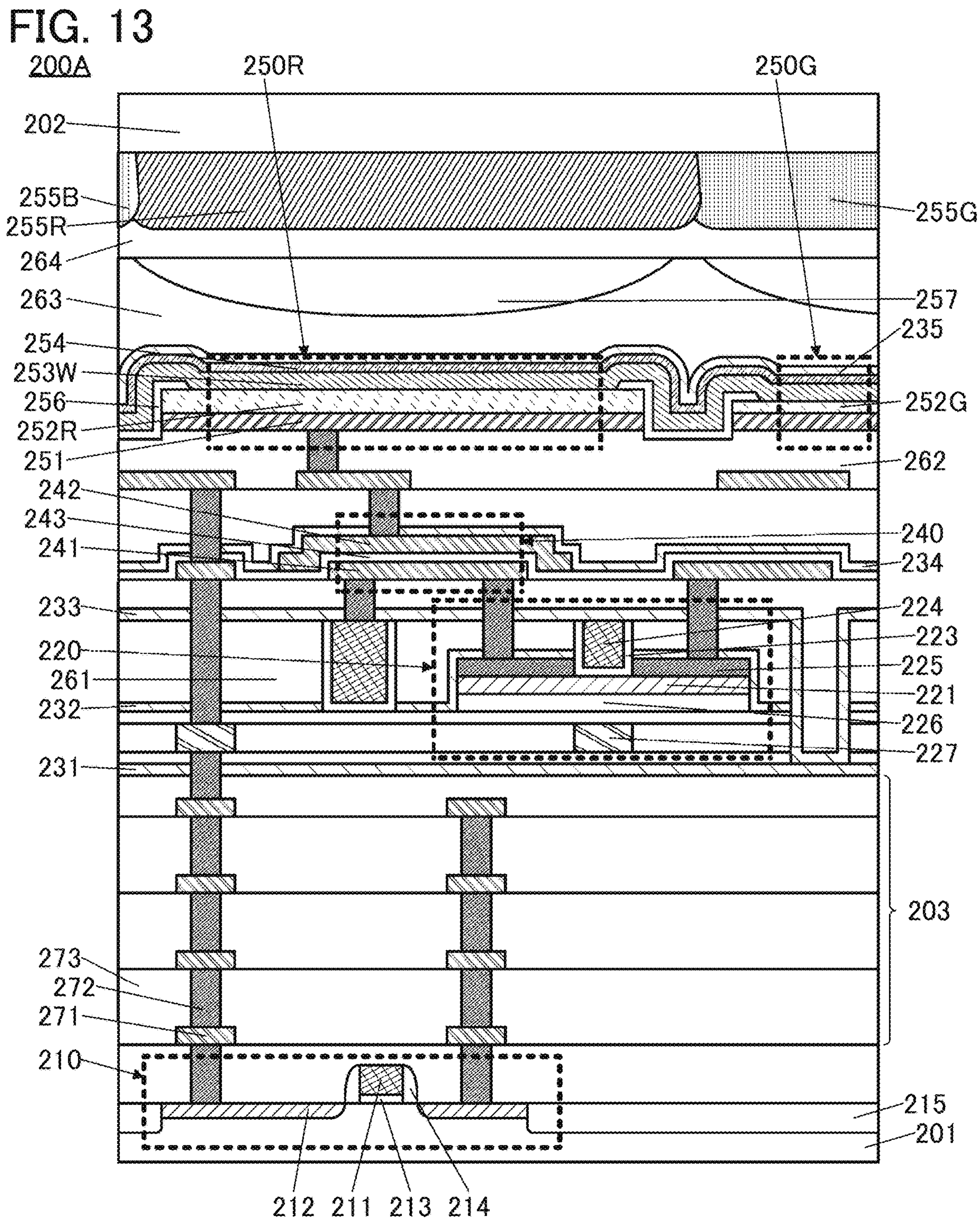
FIG. 13 is a diagram illustrating a structure example of a display apparatus.

FIG. 13 is a schematic cross-sectional view of a display apparatus 200A. The display apparatus 200A includes a light-emitting element 250R, a light-emitting element 250G, a transistor 210, a transistor 220, a capacitor 240, and the like between a substrate 201 and a substrate 202.

The transistor 210 is a transistor whose channel formation region is formed in the substrate 201. As the substrate 201, a semiconductor substrate such as a single crystal silicon substrate can be used, for example. The transistor 210 includes part of the substrate 201, a conductive layer 211, a low-resistance region 212, an insulating layer 213, an insulating layer 214, and the like. The conductive layer 211 functions as a gate electrode. The insulating layer 213 is positioned between the substrate 201 and the conductive layer 211 and functions as a gate insulating layer. The low-resistance region 212 is a region where the substrate 201 is doped with an impurity, and functions as one of a source and a drain. The insulating layer 214 is provided to cover a side surface of the conductive layer 211.

In addition, an element isolation layer 215 is provided between two adjacent transistors 210 to be embedded in the substrate 201.

A wiring layer 203 is provided between the transistor 210 and the transistor 220. The wiring layer 203 has a structure in which layers each including one or more wirings are stacked. Each of the layers includes a conductive layer 271, and an interlayer insulating layer 273 is provided between two layers. Furthermore, the conductive layers 271 of different layers are electrically connected to one another with plugs 272 provided in the interlayer insulating layers 273.

The transistor 220 is provided over the wiring layer 203. The transistor 220 is a transistor in which a metal oxide (also referred to as an oxide semiconductor) is used in a semiconductor layer where a channel is formed.

The transistor 220 includes a semiconductor layer 221, an insulating layer 223, a conductive layer 224, a pair of conductive layers 225, an insulating layer 226, a conductive layer 227, and the like.

An insulating layer 231 is provided over the wiring layer 203. The insulating layer 231 functions as a barrier layer that prevents diffusion of impurities such as water and hydrogen from the wiring layer 203 side into the transistor 220 and release of oxygen from the semiconductor layer 221 to the wiring layer 203 side. As the insulating layer 231, for example, a film in which hydrogen or oxygen is less likely to diffuse than in a silicon oxide film, such as an aluminum oxide film, a hafnium oxide film, and a silicon nitride film, can be used.

The conductive layer 227 is provided over the insulating layer 231, and the insulating layer 226 is provided to cover the conductive layer 227. The conductive layer 227 functions as a first gate electrode of the transistor 220, and part of the insulating layer 226 functions as a first gate insulating layer. For at least in a portion in contact with the semiconductor layer 221 in the insulating layer 226, an oxide insulating film such as a silicon oxide film is preferably used.

The insulating layer 221 is provided over the semiconductor layer 226. The semiconductor layer 221 preferably includes a film of a metal oxide having semiconductor characteristics (also referred to as an oxide semiconductor).

In the case where the semiconductor layer 221 is an In-M-Zn oxide, examples of the atomic ratio of metal elements of a sputtering target used for depositing an In-M-Zn oxide include In:M:Zn=1:1:1, In:M:Zn=1:1:1.2, In:M:

Zn=1:3:2, In:M:Zn=1:3:4, In:M:Zn=1:3:6, In:M:Zn=2:2:1, In:M:Zn=2:1:3, In:M:Zn=3:1:2, In:M:Zn=4:2:3, In:M:Zn=4:2:4.1, In:M:Zn=5:1:3, In:M:Zn=5:1:6, In:M:Zn=5:1:7, In:M:Zn=5:1:8, In:M:Zn=6:1:6, and In:M:Zn=5:2:5.

The target containing a polycrystalline oxide is preferably used as the sputtering target, in which case the semiconductor layer 221 having crystallinity is easily formed. Note that the atomic ratio in the semiconductor layer 221 to be deposited varies in the range of ±40% from any of the above atomic ratios of the metal elements contained in the sputtering target. For example, in the case where the composition of a sputtering target used for the semiconductor layer 221 is In:Ga:Zn=4:2:4.1 [atomic ratio], the composition of the semiconductor layer 221 to be deposited is in some cases in the neighborhood of In:Ga:Zn=4:2:3 [atomic ratio].

Note that when the atomic ratio is described as In:Ga:Zn=4:2:3 or in the neighborhood thereof, the case is included where Ga is greater than or equal to 1 and less than or equal to 3 and Zn is greater than or equal to 2 and less than or equal to 4 with In being 4. When the atomic ratio is described as In:Ga:Zn=5:1:6 or in the neighborhood thereof, the case is included where Ga is greater than 0.1 and less than or equal to 2 and Zn is greater than or equal to 5 and less than or equal to 7 with In being 5. When the atomic ratio is described as In:Ga:Zn=1:1:1 or in the neighborhood thereof, the case is included where Ga is greater than 0.1 and less than or equal to 2 and Zn is greater than 0.1 and less than or equal to 2 with In being 1.

The energy gap of the semiconductor layer 221 is 2 eV or more, preferably 2.5 eV or more. With the use of a metal oxide having a wider energy gap than silicon, the off-state current of the transistor can be reduced.

The semiconductor layer 221 preferably has a non-single-crystal structure. Examples of the non-single-crystal structure include a CAAC structure to be described later, a polycrystalline structure, a microcrystalline structure, and an amorphous structure. Among the non-single-crystal structures, the amorphous structure has the highest density of defect states, whereas the CAAC structure has the lowest density of defect states.

A CAAC (c-axis aligned crystal) will be described below. A CAAC refers to an example of a crystal structure.

The CAAC structure is a crystal structure of a thin film or the like that has a plurality of nanocrystals (crystal regions having a maximum diameter of less than 10 nm), characterized in that the nanocrystals have c-axis alignment in a particular direction and are not aligned but continuously connected in the a-axis and b-axis directions without forming a grain boundary. In particular, in a thin film having the CAAC structure, the c-axis of nanocrystals are likely to be aligned in the thin film thickness direction, the normal direction of the surface where the thin film is formed, or the normal direction of the surface of the thin film.

A CAAC-OS (Oxide Semiconductor) is an oxide semiconductor with high crystallinity. On the other hand, in the CAAC-OS, it can be said that a reduction in electron mobility due to the crystal grain boundary is less likely to occur because a clear crystal grain boundary cannot be observed. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability.

Here, in crystallography, in a unit cell formed with three axes (crystal axes) of the a-axis, the b-axis, and the c-axis, a specific axis is generally taken as the c-axis. In particular, in the case of a crystal having a layered structure, two axes parallel to the plane direction of a layer are regarded as the a-axis and the b-axis and an axis intersecting with the layer is regarded as the c-axis in general. Typical examples of such a crystal having a layered structure include graphite, which is classified as a hexagonal system. In a unit cell of graphite, the a-axis and the b-axis are parallel to a cleavage plane and the c-axis is orthogonal to the cleavage plane. For example, an $InGaZnO_4$ crystal having a $YbFe_2O_4$ type crystal structure, which is a layered structure, can be classified as a hexagonal system, and in a unit cell thereof, the a-axis and the b-axis are parallel to the plane direction of a layer and the c-axis is orthogonal to the layer (i.e., the a-axis and the b-axis).

In an image observed with a TEM, crystal parts cannot be found clearly in an oxide semiconductor film having a microcrystalline structure (a microcrystalline oxide semiconductor film) in some cases. Inmost cases, the size of a crystal part included in the microcrystalline oxide semiconductor film is greater than or equal to 1 nm and less than or equal to 100 nm, or greater than or equal to 1 nm and less than or equal to 10 nm. In particular, an oxide semiconductor film including a nanocrystal (nc) that is a microcrystal with a size greater than or equal to 1 nm and less than or equal to 10 nm, or greater than or equal to 1 nm and less than or equal to 3 nm is referred to as an nc-OS (nanocrystalline Oxide Semiconductor) film. In an image observed with a TEM, for example, a crystal grain boundary cannot be found clearly in the nc-OS film in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different crystal parts in the nc-OS film. Thus, the orientation in the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the size of a crystal part, a peak that shows a crystal plane does not appear. Furthermore, a diffraction pattern like a halo pattern is observed when the nc-OS film is subjected to electron diffraction (also referred to as selected-area electron diffraction) using an electron beam with a probe diameter (e.g., 50 nm or larger) that is larger than the diameter of a crystal part. Meanwhile, in some cases, a circular (ring-like) region with high luminance is observed in an electron diffraction pattern (also referred to as nanobeam electron diffraction pattern) of the nc-OS film, which is obtained using an electron beam with a probe diameter close to or smaller than the diameter of a crystal part (e.g., 1 nm or larger and 30 nm or smaller), and spots are observed in the ring-like region.

The nc-OS film has a lower density of defect states than an amorphous oxide semiconductor film. Note that there is no regularity of crystal orientation between different crystal parts in the nc-OS film. Thus, the nc-OS film has a higher density of defect states than the CAAC-OS film. Therefore, the nc-OS film has a higher carrier density and higher electron mobility than the CAAC-OS film in some cases. Accordingly, a transistor using the nc-OS film may have high field-effect mobility.

The nc-OS film can be formed at a smaller oxygen flow rate ratio in deposition than the CAAC-OS film. The nc-OS film can also be formed at a lower substrate temperature in deposition than the CAAC-OS film. For example, the nc-OS film can be deposited at a relatively low substrate temperature (e.g., a temperature of 130° C. or lower) or without heating of the substrate and thus is suitable for the case of using a large glass substrate, a resin substrate, or the like, and productivity can be increased.

An example of a crystal structure of a metal oxide is described. A metal oxide that is formed by a sputtering method using an In—Ga—Zn oxide target (In:Ga:Zn=4:2:4.1 [atomic ratio]) at a substrate temperature higher than or equal to 100° C. and lower than or equal to 130° C. is likely to have either the nc (nano crystal) structure or the CAAC structure, or a structure in which both of the structures are mixed. On the other hand, a metal oxide formed at a substrate temperature set at room temperature (R.T.) is likely to have the nc crystal structure. Note that room temperature (R.T.) here also includes a temperature of the case where a substrate is not heated intentionally.

The pair of conductive layers 225 is provided over and in contact with the semiconductor layer 221, and functions as a source electrode and a drain electrode.

An insulating layer 232 is provided to cover top surfaces and side surfaces of the pair of conductive layers 225, the side surfaces of the semiconductor layer 221, and the like, and an insulating layer 261 is provided over the insulating layer 232. The insulating layer 232 functions as a barrier layer that prevents diffusion of impurities such as water or hydrogen from the interlayer insulating layer or the like to the semiconductor layer 221 and release of oxygen from the semiconductor layer 221. As the insulating layer 232, an insulating film similar to the above insulating layer 231 can be used.

An opening reaching the semiconductor layer 221 is provided in the insulating layer 232 and the insulating layer 261. The insulating layer 223 that is in contact with side surfaces of the insulating layer 261, the insulating layer 232, and the conductive layers 225 and top surface of the semiconductor layer 221, and the conductive layer 224 over the insulating layer 223 are embedded in the opening. The conductive layer 224 functions as a second gate electrode and the insulating layer 223 functions as a second gate insulating layer.

The top surface of the conductive layer 224, the top surface of the insulating layer 223, and the top surface of the insulating layer 261 are planarized so that they are substantially level with each other, and an insulating layer 233 is provided to cover these layers. An opening portion is provided in the stacked-layer structure between the insulating layer 233 and the insulating layer 231, and part of the insulating layer 233 is in contact with the insulating layer 231 in the opening portion. The insulating layer 261 functions as an interlayer insulating layer. The insulating layer 233 functions as a barrier layer that prevents diffusion of impurities such as water and hydrogen from layers above. As the insulating layer 233, an insulating film similar to the above insulating layer 231 or the like can be used.

A capacitor 240 is provided over the insulating layer 233.

The capacitor 240 includes a conductive layer 241, a conductive layer 242, and an insulating layer 243 positioned therebetween. The conductive layer 241 functions as one electrode of the capacitor 240, the conductive layer 242 functions as the other electrode of the capacitor 240, and the insulating layer 243 functions as a dielectric of the capacitor 240.

An insulating layer 234 is provided to cover the capacitor 240. As the insulating layer 234, an insulating film similar to the above insulating layer 231 can be used. An insulating layer 262 is provided over the insulating layer 231 with an interlayer insulating layer and a wiring positioned therebetween, and the light-emitting element 250R and the light-emitting element 250G are provided over the insulating layer 262.

The light-emitting element 250R includes a conductive layer 251, a conductive layer 252R, an EL layer 253W, a conductive layer 254, and the like.

The conductive layer 251 has a property of reflecting visible light, and the conductive layer 252R has a property of transmitting visible light. The conductive layer 254 has a property of reflecting and transmitting visible light. The conductive layer 252R functions as an optical adjustment layer for adjusting the optical path length between the conductive layer 251 and the conductive layer 254. The thickness of the optical adjustment layer can differ between the light-emitting elements of different emission colors. The thickness of the conductive layer 252R included in the light-emitting element 250R is different from the thickness of a conductive layer 252G included in the light-emitting element 250G.

An insulating layer 256 is provided to cover an end portion of the conductive layer 252R and an end portion of the conductive layer 252G.

The EL layer 253W and the conductive layer 254 are provided across a plurality of pixels to be shared by the plurality of pixels. The EL layer 253W includes a light-emitting layer that emits white light.

An insulating layer 235 is provided to cover the light-emitting element 250R and the light-emitting element 250G. The insulating layer 235 functions as a barrier film that prevents diffusion of impurities such as water into the light-emitting element 250R, the light-emitting element 250G and the like. As the insulating layer 235, a film similar to the insulating layer 231 can be used.

A lens array 257 is provided over the light-emitting element 250R and the light-emitting element 250G with an adhesive layer 263 therebetween. Light emitted from the light-emitting element 250R is condensed by the lens array 257, colored by a coloring layer 255R, and emitted to the outside. The lens array 257 may be omitted if not needed.

The coloring layer 255R, a coloring layer 255G, and a coloring layer 255B are provided over the lens array 257 with an insulating layer 264 therebetween. The coloring layer 255R is provided over the light-emitting element 250R with the lens array 257 therebetween. The coloring layer 255G is provided over the light-emitting element 250G. Part of the coloring layer 255B is illustrated in FIG. 13.

For example, the coloring layer 255R transmits red light, the coloring layer 255G transmits green light, and the coloring layer 255B transmits blue light. This can increase the color purity of light from each light-emitting element, so that a display apparatus with higher display quality can be achieved.

The display apparatus 200A includes the substrate 202 on the viewer side. The substrate 202 and the substrate 201 are bonded to each other. As the substrate 202, a substrate having a light-transmitting property, such as a glass substrate, a quartz substrate, a sapphire substrate, or a plastic substrate, can be used.

The coloring layer 255R, the coloring layer 255G, and the coloring layer 255B are formed on the surface of the substrate 202 on the substrate 201 side. The insulating layer 264 is provided to cover the coloring layer 255R and the like, and the lens array 257 is provided on the surface of the insulating layer 264 on the substrate 201 side. The substrate 202 provided with the coloring layer 255R, the coloring layer 255G, the coloring layer 255B, and the lens array 257 and the substrate 201 are bonded to each other with the adhesive layer 263. As described above, when the coloring layer 255R, the coloring layer 255G, the coloring layer 255B and the lens array 257 are provided on the substrate 202 side, the heat treatment temperature in the manufacturing process of them can be increased.

Note that although the coloring layer 255R, the coloring layer 255G, the coloring layer 255B, and the lens array 257 are formed on the substrate 202 side, each coloring layer and the lens array 257 may be formed over the insulating layer 235. In that case, the alignment accuracy of the light-emitting elements and the coloring layers can be increased compared with the case where the substrate 201 is bonded with the substrate 202 after the coloring layers are formed on the substrate 202 side.

With such a structure, a display apparatus with extremely high resolution and high display quality can be achieved.

Cross-Sectional Structure Example 2

Figure 14:
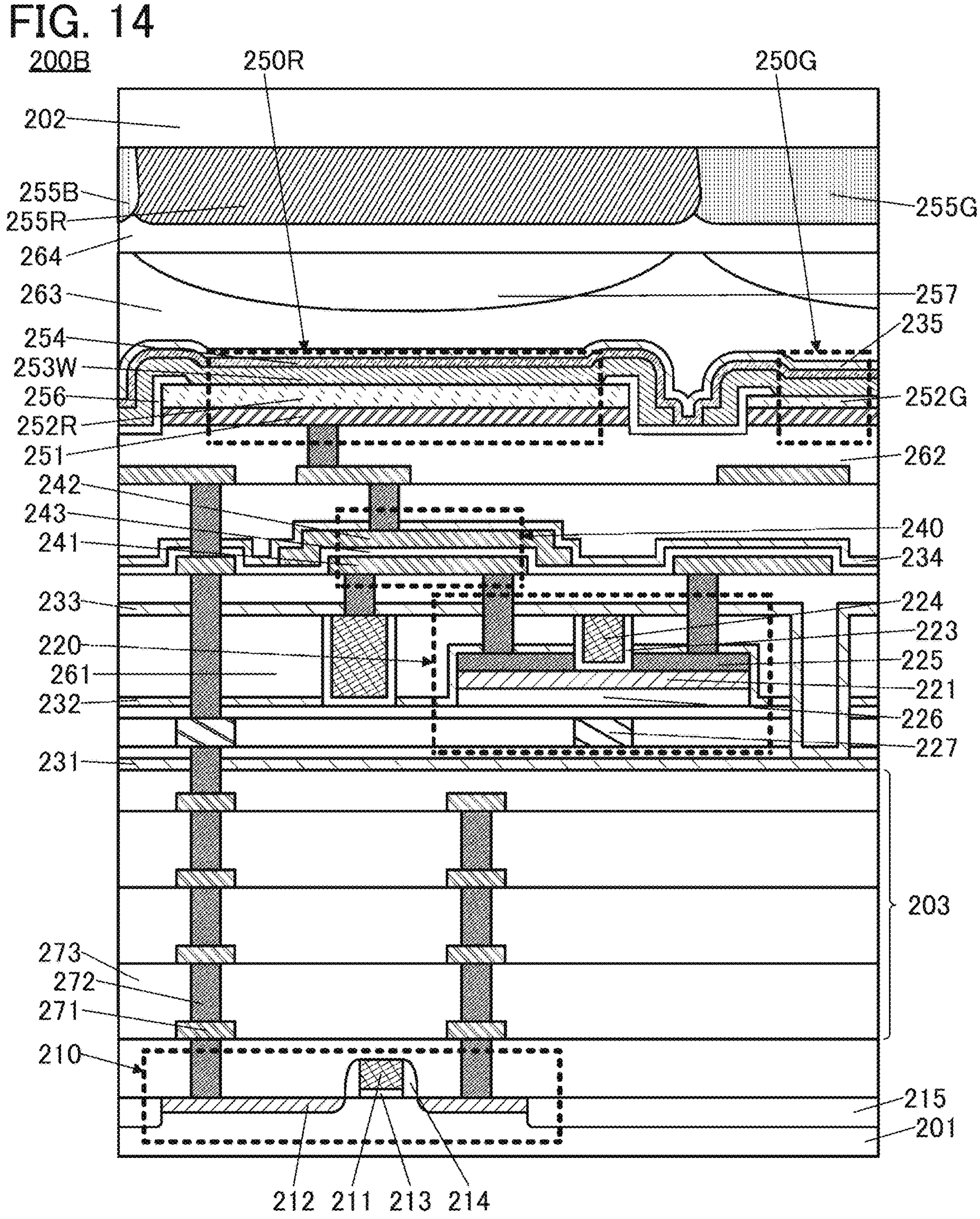
FIG. 14 is a diagram illustrating a structure example of a display apparatus.

FIG. 14 illustrates a schematic cross-sectional view of a display apparatus 200B with a structure partly different from the above display apparatus 200A.

The display apparatus 200B shows an example in which the EL layer 253W is separated over the insulating layer 256 positioned between two light-emitting elements. Generation of leakage current between the light-emitting elements through the EL layer 253W can be prevented by separating the EL layer 253W. This is preferable because unintentional light emission can be prevented, and contrast and color reproducibility can be improved.

The EL layer 253W may be formed separately by an evaporation method using a fine metal mask, but it is preferably processed finely by a photolithography method.

Cross-Sectional Structure Example 3

Figure 15:
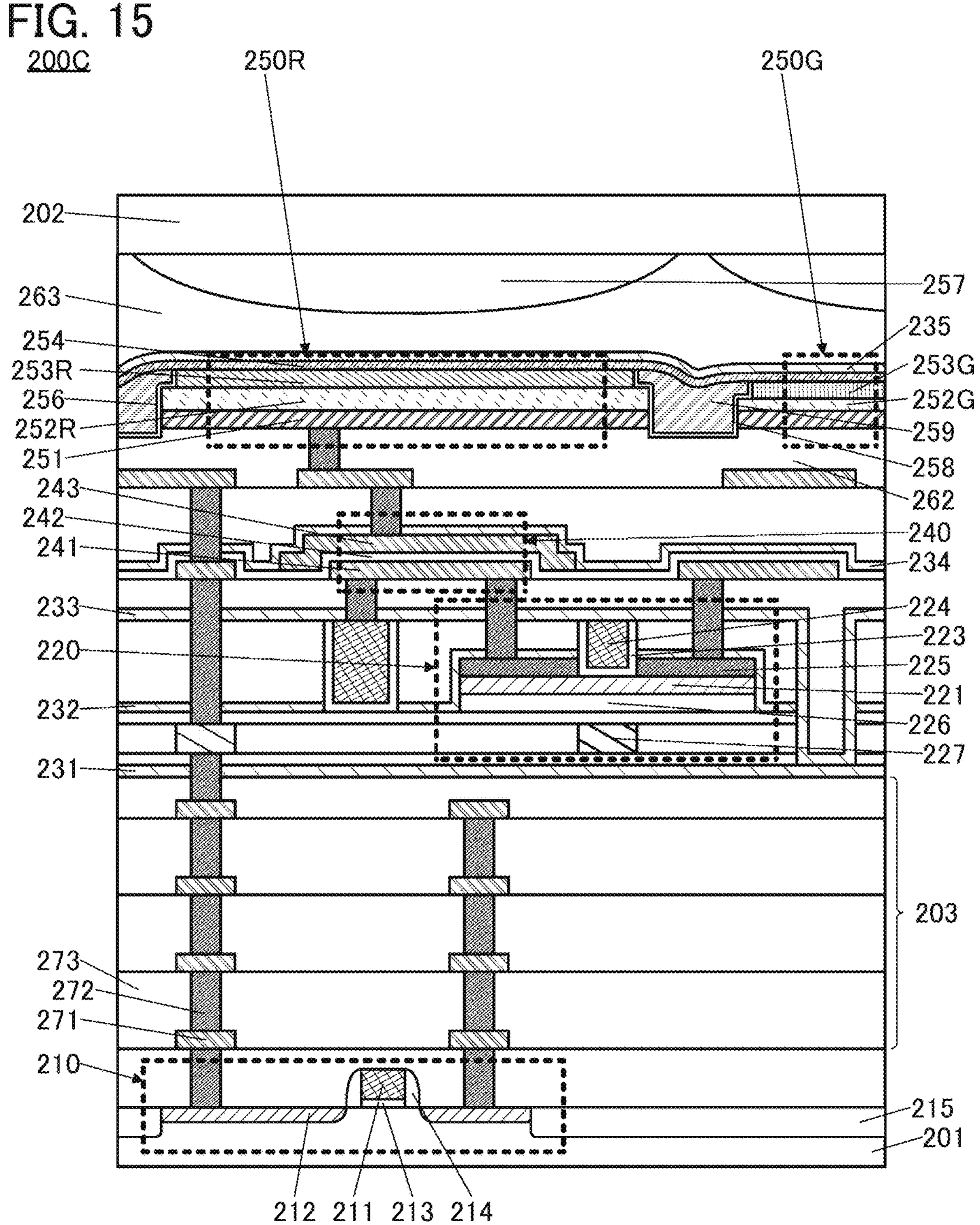
FIG. 15 is a diagram illustrating a structure example of a display apparatus.

FIG. 15 is a schematic cross-sectional view of a display apparatus 200C.

The light-emitting element 250R includes an EL layer 253R that emits red light. The light-emitting element 250G includes an EL layer 253G that emits green light.

Here, an example that the display apparatus 200C includes no coloring layer is shown.

In addition, the EL layer 253R and the EL layer 253G are processed so as not to be in contact with each other between two adjacent light-emitting elements. In other words, between the two adjacent light-emitting elements, an end portion of the EL layer 253R and an end portion of the EL layer 253G are provided to face each other over the insulating layer 256. Although the EL layer 253R and the EL layer 253G may be formed separately by an evaporation method using a fine metal mask, they are each preferably processed finely by a photolithography method.

Furthermore, between the light-emitting element 250R and the light-emitting element 250G, the insulating layer 258 is provided in contact with a side surface of the EL layer 253R, a side surface of the conductive layer 252R, side surfaces of the pair of conductive layers 251, a top surface of the insulating layer 262, a side surface of the conductive layer 252G, and a side surface of the EL layer 253G. A material having low water-transmitting property can be used for the insulating layer 258 and an insulating film similar to the above insulating layer 231 can be used. In particular, an inorganic insulating film formed by an ALD method is preferably used. An aluminum oxide film formed by an ALD method is further preferably used.

A resin layer 259 is provided over the insulating layer 258 to fill the depression portion positioned between the adjacent pixels. The resin layer 259 functions as a planarization film and has a function of improving coverage with a film formed thereover (e.g., the conductive layer 254).

Although the case where the conductive layer 252R and the conductive layer 252G functioning as the optical adjustment layers each have different thickness is shown here, the optical adjustment layers of the light-emitting elements may have the same thickness. At this time, it is preferable to use part of the EL layer as the optical adjustment layer and to control the optical path length by its thickness. Alternatively, the conductive layer 252R, the conductive layer 252G, and the like are not necessarily provided.

Cross-Sectional Structure Example 4

Figure 16:
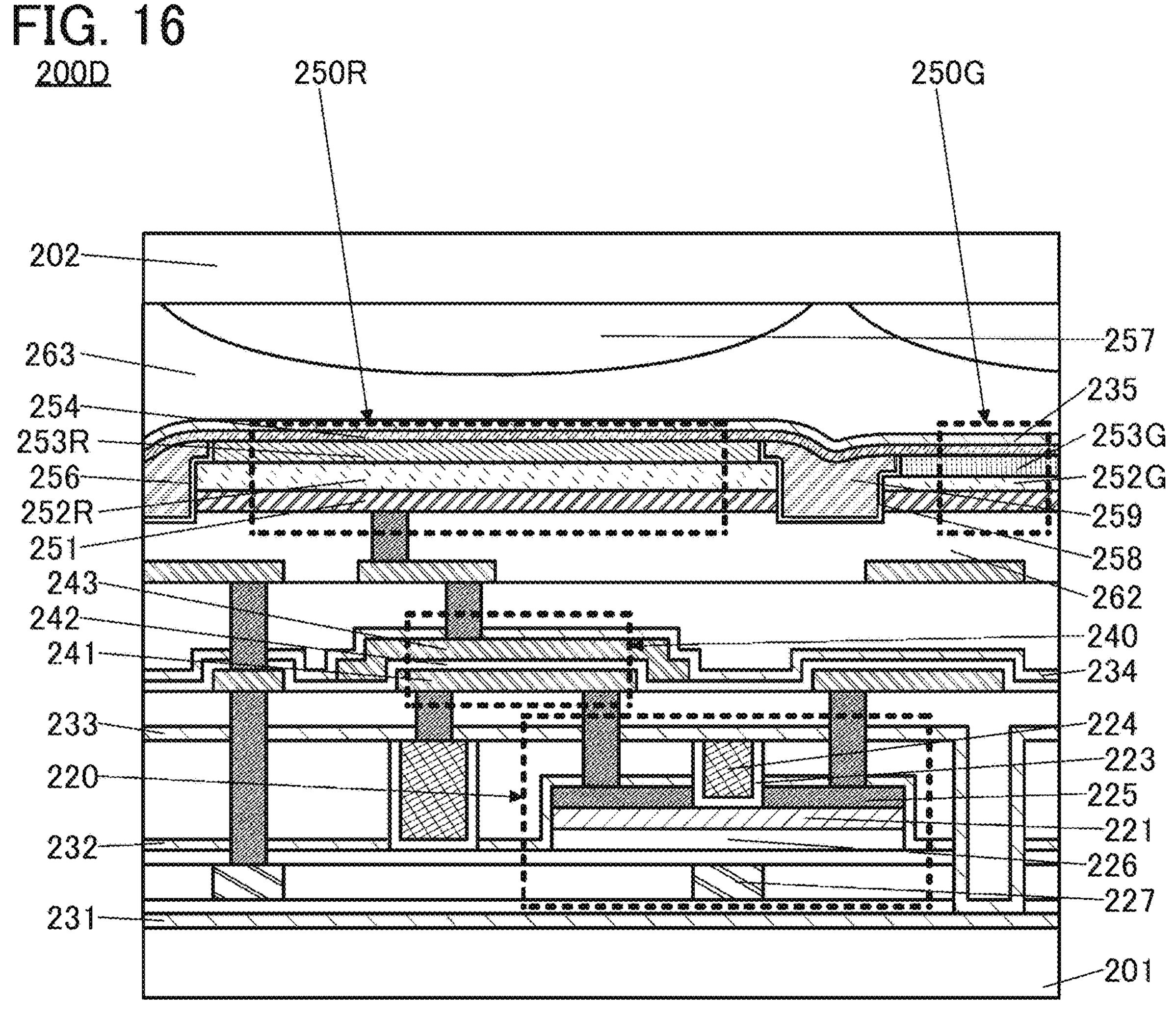
FIG. 16 is a diagram illustrating a structure example of a display apparatus.

FIG. 16 is a schematic cross-sectional view of a display apparatus 200D. The display apparatus 200D is different from the display apparatus 200C mainly in that the transistor 210 is not included.

The insulating layer 231 is provided over the substrate 201, and the transistor 220 is provided over the insulating layer 231. In the case where there is no possibility that impurities or the like diffuse from the substrate 201, the insulating layer 231 is not necessarily provided.

As the substrate 201, a substrate having a low thermal expansion coefficient is preferably used. For example, it is preferable to use a single crystal semiconductor substrate of single crystal silicon, silicon carbide, or the like, a high-melting-point insulating substrate of sapphire, quartz, or the like, or the like.

The above is the description of the cross-sectional structure examples.

At least part of the structure examples, the drawings corresponding thereto, and the like described in this embodiment can be combined with the other structure examples, the other drawings, and the like as appropriate.

At least part of this embodiment can be implemented in combination with the other embodiments described in this specification as appropriate.

Embodiment 2

In this embodiment, a light-emitting element (also referred to as a light-emitting device) and a light-receiving element (also referred to as a light-receiving device) that can be used in a light-emitting and light-receiving apparatus of one embodiment of the present invention will be described.

In this specification and the like, a device formed using a metal mask or an FMM (fine metal mask) may be referred to as a device having an MM (metal mask) structure. In addition, in this specification and the like, a device formed without using a metal mask or an FMM may be referred to as a device having an MML (metal maskless) structure.

Note that in this specification and the like, a structure in which light-emitting layers in light-emitting devices of different colors (here, blue (B), green (G), and red (R)) are separately formed or separately patterned may be referred to as an SBS (Side By Side) structure. In this specification and the like, a light-emitting device capable of emitting white light may be referred to as a white-light-emitting device.

Note that a combination of white-light-emitting devices with coloring layers (e.g., color filters) enables a full-color display apparatus.

[Light-Emitting Device]

Light-emitting devices can be classified roughly into a single structure and a tandem structure. A device having a single structure includes one light-emitting unit between a pair of electrodes, and the light-emitting unit preferably includes one or more light-emitting layers. To obtain white light emission with a single structure, two or more light-emitting layers are selected so that emission colors of the light-emitting layers have a relationship of complementary colors. For example, when an emission color of a first light-emitting layer and an emission color of a second light-emitting layer are complementary colors, the light-emitting device can be configured to emit white light as a whole. The same applies to a light-emitting device including three or more light-emitting layers.

A device having a tandem structure includes two or more light-emitting units between a pair of electrodes, and each light-emitting unit preferably includes one or more light-emitting layers. When light-emitting layers that emit light of the same color are used in each light-emitting unit, luminance per predetermined current can be increased, and the light-emitting device can have higher reliability than that with a single structure. To obtain white light emission with a tandem structure, a structure in which white light emission can be obtained by combining light from light-emitting layers of a plurality of light-emitting units is employed. Note that a combination of emission colors for obtaining white light emission is similar to that in the case of a single structure. In the device having a tandem structure, an intermediate layer such as a charge-generation layer is suitably provided between the plurality of light-emitting units.

When the above white-light-emitting device (having a single structure or a tandem structure) and a light-emitting device having an SBS structure are compared to each other, the light-emitting device having an SBS structure can have lower power consumption than the white-light-emitting device. The light-emitting device having an SBS structure is suitable for the case where the power consumption is required to be low. Meanwhile, the white-light-emitting device is suitable in terms of lower manufacturing cost or higher manufacturing yield because the manufacturing process of the white-light-emitting device is simpler than that of the light-emitting device having an SBS structure.

<Structure Example of Light-Emitting Device>

Figure 17A:
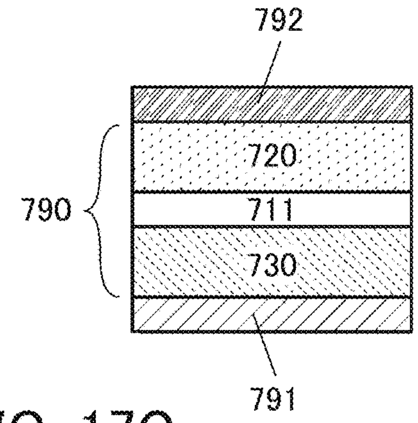
FIG. 17A to FIG. 17F are diagrams illustrating structure examples of a light-emitting device.

As shown in FIG. 17A, the light-emitting device includes an EL layer 790 between a pair of electrodes (a lower electrode 791 and an upper electrode 792). The EL layer 790 can be formed of a plurality of layers such as a layer 720, a light-emitting layer 711, and a layer 730. The layer 720 can include, for example, a layer containing a substance with a high electron-injection property (an electron-injection layer) and a layer containing a substance with a high electron-transport property (an electron-transport layer). The light-emitting layer 711 contains a light-emitting compound, for example. The layer 730 can include a layer containing a substance having a high hole-injection property (a hole-injection layer) and a layer containing a substance having a high hole-transport property (a hole-transport layer), for example.

The structure including the layer 720, the light-emitting layer 711, and the layer 730, which is provided between the pair of electrodes, can function as a single light-emitting unit, and the structure in FIG. 17A is referred to as a single structure in this specification.

Figure 17B:
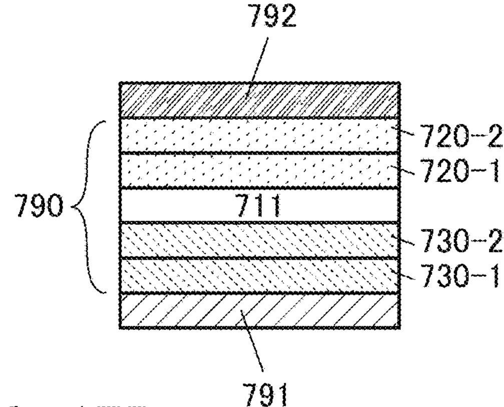

FIG. 17B is a modification example of the EL layer 790 included in the light-emitting device illustrated in FIG. 17A. Specifically, the light-emitting device illustrated in FIG. 17B includes a layer 730-1 over the lower electrode 791, a layer 730-2 over the layer 730-1, the light-emitting layer 711 over the layer 730-2, a layer 720-1 over the light-emitting layer 711, a layer 720-2 over the layer 720-1, and the upper electrode 792 over the layer 720-2. For example, when the lower electrode 791 functions as an anode and the upper electrode 792 functions as a cathode, the layer 730-1 functions as a hole-injection layer, the layer 730-2 functions as a hole-transport layer, the layer 720-1 functions as an electron-transport layer, and the layer 720-2 functions as an electron-injection layer. Alternatively, when the lower electrode 791 functions as a cathode and the upper electrode 792 functions as an anode, the layer 730-1 functions as an electron-injection layer, the layer 730-2 functions as an electron-transport layer, the layer 720-1 functions as a hole-transport layer, and the layer 720-2 functions as the hole-injection layer. With such a layer structure, carriers can be efficiently injected to the light-emitting layer 711, and the efficiency of the recombination of carriers in the light-emitting layer 711 can be enhanced.

Figure 17C:
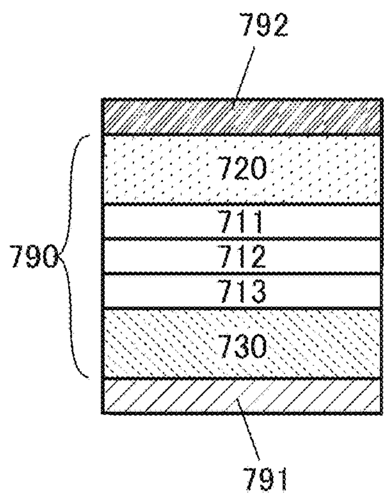
Figure 17D:
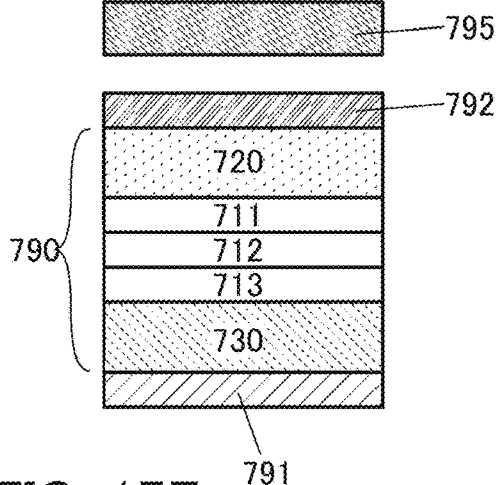

Note that structures in which a plurality of light-emitting layers (light-emitting layers 711, 712, and 713) are provided between the layer 720 and the layer 730 as illustrated in FIG. 17C and FIG. 17D are variations of the single structure.

Figure 17E:
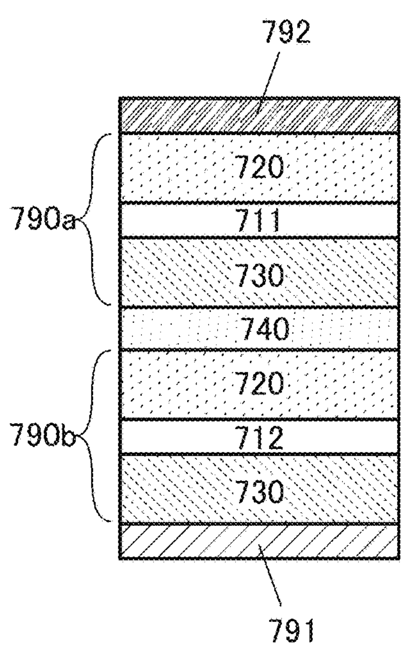
Figure 17F:
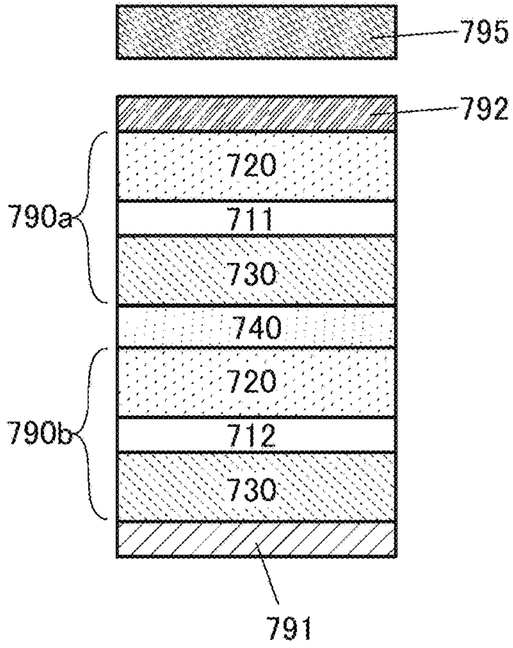

A structure in which a plurality of light-emitting units (an EL layer 790*a* and an EL layer 790*b*) are connected in series with an intermediate layer (charge-generation layer) 740 therebetween as illustrated in FIG. 17E and FIG. 17F is referred to as a tandem structure in this specification. In this specification and the like, the structure illustrated in FIG. 17E and FIG. 17F is referred to as a tandem structure; however, without being limited to this, a tandem structure may be referred to as a stack structure, for example. The tandem structure enables a light-emitting device capable of high-luminance light emission.

In FIG. 17C, light-emitting materials that emit the same light may be used for the light-emitting layer 711, the light-emitting layer 712, and the light-emitting layer 713.

Alternatively, different light-emitting materials may be used for the light-emitting layer 711, the light-emitting layer 712, and the light-emitting layer 713. White light emission can be obtained when the light-emitting layer 711, the light-emitting layer 712, and the light-emitting layer 713 emit light of complementary colors. FIG. 17D illustrates an example in which a coloring layer 795 functioning as a color filter is provided. When white light passes through the color filter, light of a desired color can be obtained.

In FIG. 17E, the same light-emitting material may be used for the light-emitting layer 711 and the light-emitting layer 712. Alternatively, light-emitting materials that emit light of different colors may be used for the light-emitting layer 711 and the light-emitting layer 712. White light emission is obtained when the light-emitting layer 711 and the light-emitting layer 712 emit light of complementary colors. FIG. 17F illustrates an example in which the coloring layer 795 is further provided.

Also in the structures illustrated in FIG. 17C, FIG. 17D, FIG. 17E, and FIG. 17F, the layer 720 and the layer 730 may each have a stacked-layer structure of two or more layers as illustrated in FIG. 17B.

In FIG. 17D, the same light-emitting material may be used for the light-emitting layer 711, the light-emitting layer 712, and the light-emitting layer 713. Similarly, in FIG. 17F, the same light-emitting material may be used for the light-emitting layer 711 and the light-emitting layer 712. Here, when a color conversion layer is used instead of the coloring layer 795, light of a desired color different from the emission color of the light-emitting material can be obtained. For example, a blue-light-emitting material is used for each light-emitting layer and blue light passes through the color conversion layer, whereby light with a wavelength longer than that of blue light (e.g., red light or green light) can be obtained. For the color conversion layer, a fluorescent material, a phosphorescent material, quantum dots, or the like can be used.

The emission color of the light-emitting device can be red, green, blue, cyan, magenta, yellow, white, or the like depending on the material that constitutes the EL layer 790. Furthermore, the color purity can be further increased when the light-emitting device has a microcavity structure.

The light-emitting device that emits white light preferably contains two or more kinds of light-emitting substances in the light-emitting layer. To obtain white light emission, two or more kinds of light-emitting substances are selected such that their emission colors are complementary. For example, when emission colors of a first light-emitting layer and a second light-emitting layer are complementary colors, the light-emitting device can be configured to emit white light as a whole. The same applies to a light-emitting device including three or more light-emitting layers.

The light-emitting layer preferably contains two or more light-emitting substances that emit light of R (red), G (green), B (blue), Y (yellow), O (orange), and the like. Alternatively, the light-emitting layer preferably contains two or more light-emitting substances that emit light containing two or more of spectral components of R, G, and B.

[Light-Emitting Device]

Here, a specific structure example of a light-emitting device will be described.

The light-emitting device includes at least a light-emitting layer. In addition, the light-emitting device may further include, as a layer other than the light-emitting layer, a layer containing a substance with a high hole-injection property, a substance with a high hole-transport property, a hole-blocking material, a substance with a high electron-transport property, an electron-blocking material, a substance with a high electron-injection property, a substance with a bipolar property (a substance with a high electron-transport property and a high hole-transport property), or the like.

Either a low molecular compound or a high molecular compound can be used for the light-emitting device, and an inorganic compound may also be included. Each layer included in the light-emitting device can be formed by an evaporation method (including a vacuum evaporation method), a transfer method, a printing method, an inkjet method, a coating method, or the like.

For example, the light-emitting device can include one or more of a hole-injection layer, a hole-transport layer, a hole-blocking layer, an electron-blocking layer, an electron-transport layer, and an electron-injection layer in addition to the light-emitting layer.

The hole-injection layer is a layer injecting holes from an anode to the hole-transport layer, and a layer containing a material with a high hole-injection property. Examples of a material with a high hole-injection property include an aromatic amine compound and a composite material containing a hole-transport material and an acceptor material (electron-accepting material).

The hole-transport layer is a layer transporting holes, which are injected from the anode by the hole-injection layer, to the light-emitting layer. The hole-transport layer is a layer containing a hole-transport material. As the hole-transport material, a substance having a hole mobility greater than or equal to $1\times10^{-6}$ $cm^2/Vs$ is preferable. Note that other substances can also be used as long as they have a property of transporting more holes than electrons. As the hole-transport material, materials with a high hole-transport property, such as a Tc-electron rich heteroaromatic compound (e.g., a carbazole derivative, a thiophene derivative, and a furan derivative) and an aromatic amine (a compound having an aromatic amine skeleton), are preferable.

The electron-transport layer is a layer transporting electrons, which are injected from a cathode by the electron-injection layer, to the light-emitting layer. The electron-transport layer is a layer containing an electron-transport material. As the electron-transport material, a substance having an electron mobility greater than or equal to $1\times10^{-6}$ $cm^2/Vs$ is preferable. Note that other substances can also be used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

The electron-injection layer is a layer injecting electrons from the cathode to the electron-transport layer and a layer containing a material with a high electron-injection property. As the material with a high electron-injection property, an alkali metal, an alkaline earth metal, or a compound thereof can be used. As the material with a high electron-injection property, a composite material containing an electron-transport material and a donor material (an electron-donating material) can also be used.

For the electron-injection layer, for example, an alkali metal, an alkaline earth metal, or a compound thereof, such as lithium, cesium, ytterbium, lithium fluoride (LiF), cesium fluoride (CsF), calcium fluoride ($CaF_2$), 8-(quinolinolato) lithium (abbreviation: Liq), 2-(2-pyridyl)phenolatolithium (abbreviation: LiPP), 2-(2-pyridyl)-3-pyridinolato lithium (abbreviation: LiPPy), 4-phenyl-2-(2-pyridyl)phenolatolithium (abbreviation: LiPPP), lithium oxide ($LiO_x$), or cesium carbonate can be used. In addition, the electron-injection layer may have a stacked-layer structure of two or more layers. For example, it is possible to employ a structure where lithium fluoride is used for a first layer and ytterbium is used for a second layer as the stacked-layer structure.

Alternatively, as the above-described electron-injection layer, an electron-transport material may be used. For example, a compound having an unshared electron pair and an electron deficient heteroaromatic ring can be used for the electron-transport material. Specifically, a compound having at least one of a pyridine ring, a diazine ring (a pyrimidine ring, a pyrazine ring, and a pyridazine ring), and a triazine ring can be used.

Note that the lowest unoccupied molecular orbital (LUMO) of the organic compound having an unshared electron pair is preferably greater than or equal to −3.6 eV and less than or equal to −2.3 eV. In general, the highest occupied molecular orbital (HOMO) level and the LUMO level of an organic compound can be estimated by cyclic voltammetry (CV), photoelectron spectroscopy, optical absorption spectroscopy, inverse photoelectron spectroscopy, or the like.

For example, 4,7-diphenyl-1,10-phenanthroline (abbreviation: BPhen), 2,9-bis(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used as the organic compound having an unshared electron pair. Note that NBPhen has a higher glass transition temperature (Tg) than BPhen and thus has high heat resistance.

The light-emitting layer is a layer containing a light-emitting substance. The light-emitting layer can contain one or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance that emits near-infrared light can be used.

Examples of the light-emitting substance include a fluorescent material, a phosphorescent material, a TADF material, and a quantum dot material.

Examples of a fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of a phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material or an assist material) in addition to the light-emitting substance (guest material). As one or more kinds of organic compounds, one or both of a hole-transport material and an electron-transport material can be used. Alternatively, as one or more kinds of organic compounds, a bipolar material or a TADF material may be used.

The light-emitting layer preferably includes a phosphorescent material and a combination of a hole-transport material and an electron-transport material that easily forms an exciplex, for example. Such a structure makes it possible to efficiently obtain light emission using ExTET (Exciplex-Triplet Energy Transfer), which is energy transfer from an exciplex to a light-emitting substance (a phosphorescent material). When a combination of materials is selected to form an exciplex that exhibits light emission whose wavelength is to be overlapped with the wavelength of the lowest-energy-side absorption band of the light-emitting substance, energy can be transferred smoothly and light emission can be obtained efficiently. With the above structure, high efficiency, low-voltage driving, and a long lifetime of a light-emitting device can be achieved at the same time.

At least part of the structure examples, the drawings corresponding thereto, and the like described in this embodiment can be combined with the other structure examples, the other drawings, and the like as appropriate.

At least part of this embodiment can be implemented in combination with the other embodiments described in this specification as appropriate.

Embodiment 3

In this embodiment, structure examples of an electronic device for which the display apparatus of one embodiment of the present invention is used will be described.

The display apparatus and the display module of one embodiment of the present invention can be applied to a display portion of an electronic device or the like having a display function. Examples of such an electronic device include a digital camera, a digital video camera, a digital photo frame, a mobile phone, a portable game machine, a portable information terminal, and an audio reproducing device, in addition to electronic devices with a relatively large screen, such as a television device, a laptop personal computer, a monitor device, digital signage, a pachinko machine, and a game machine.

In particular, the display apparatus and the display module of one embodiment of the present invention can have a high resolution, and thus can be suitably used for an electronic device having a relatively small display portion. Examples of the electronic device include a watch-type or bracelet-type information terminal device (wearable device); and a wearable device worn on a head, such as a device for VR such as a head mounted display and a glasses-type device for AR.

Figure 18A:
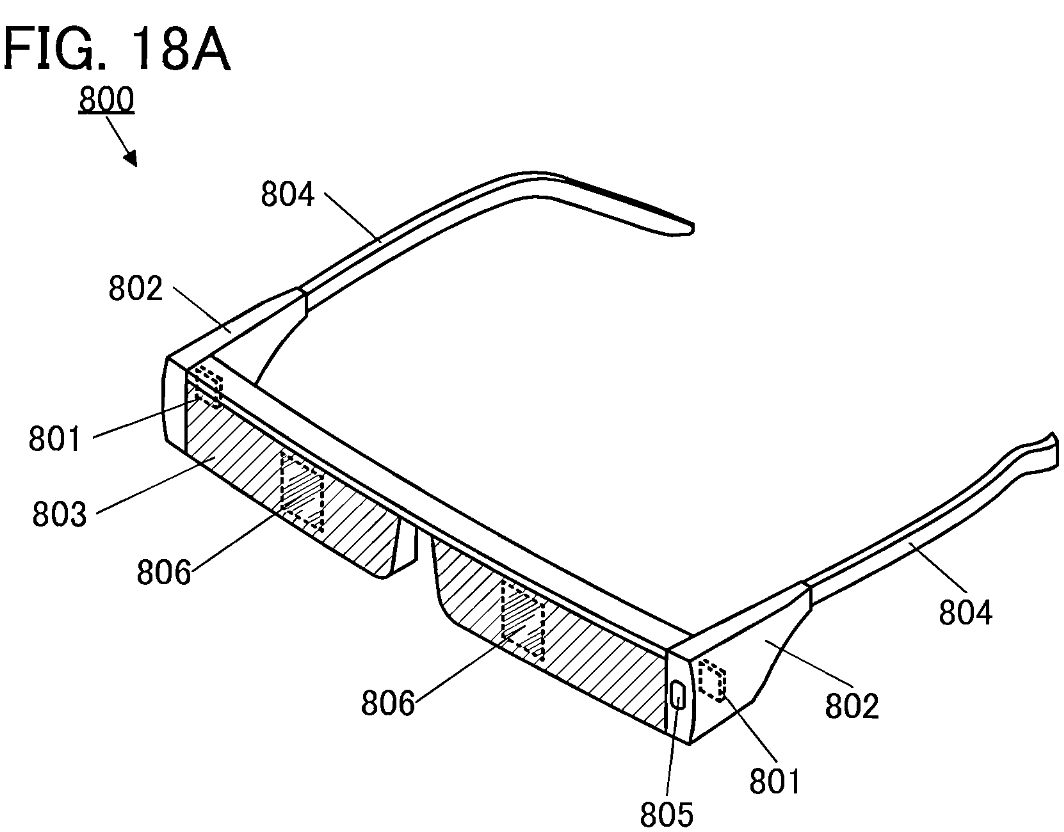
FIG. 18A and FIG. 18B are diagrams illustrating a structure example of an electronic device.

FIG. 18A is a perspective view of a glasses-type electronic device 800. The electronic device 800 includes a pair of display panels 801, a pair of housings 802, a pair of optical members 803, a pair of temples 804, and the like.

The electronic device 800 can project an image displayed on the display panels 801 onto a display regions 806 of the optical members 803. Since the optical members 803 have a light-transmitting property, a user can see images displayed on the display regions 806, which are superimposed on transmission images seen through the optical members 803. Thus, the electronic device 800 is an electronic device capable of AR display.

One housing 802 is provided with a camera 805 capable of taking an image of what lies in front thereof. Although not illustrated, one of the housings 802 is provided with a wireless receiver or a connector to which a cable can be connected, whereby a video signal or the like can be supplied to the housing 802. Furthermore, when the housing 802 is provided with an acceleration sensor such as a gyroscope sensor, the orientation of the user's head can be detected and an image corresponding to the orientation can be displayed on the display regions 806. Moreover, the housing 802 is preferably provided with a battery, and charging can be performed with or without a wire.

Figure 18B:
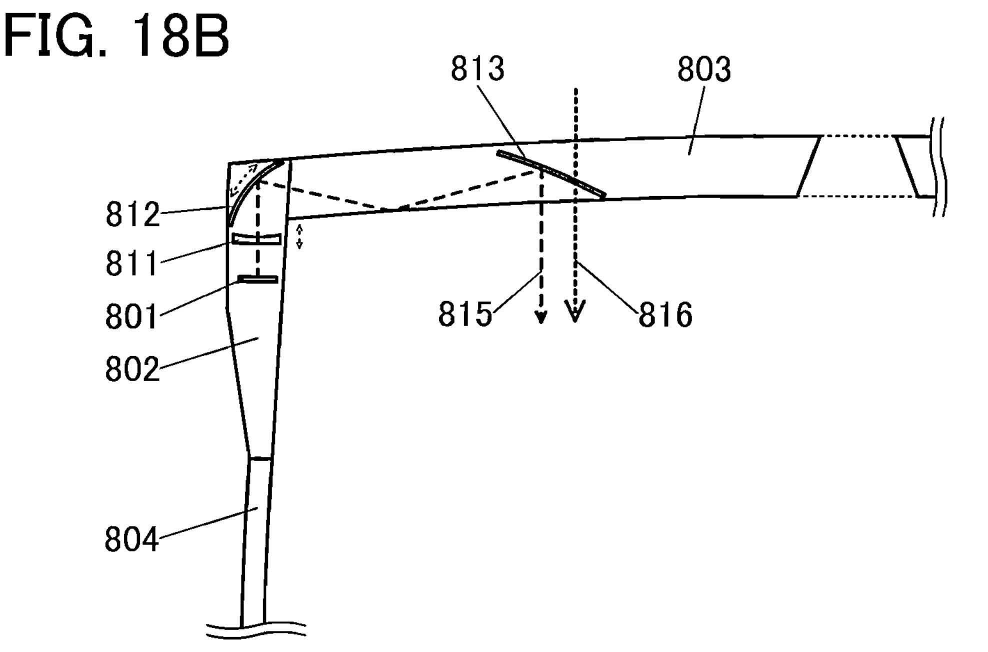

Next, a method for projecting an image on the display regions 806 of the electronic device 800 is described with reference to FIG. 18B. The display panels 801, a lens 811, and a reflective plate 812 are provided in the housing 802. In addition, a reflective surface 813 functioning as a half mirror is provided in a portion corresponding to the display regions 806 of the optical members 803.

Light 815 emitted from the display panel 801 passes through the lens 811 and is reflected by the reflective plate 812 toward the optical member 803. In the optical member 803, the light 815 is fully reflected repeatedly by end surfaces of the optical member 803 and reaches the reflective surface 813, whereby an image is projected on the reflective surface 813. Accordingly, the user can see both the light 815 reflected by the reflective surface 813 and transmitted light 816 that passes through the optical member 803 (including the reflective surface 813).

FIG. 18 shows an example in which the reflective plate 812 and the reflective surface 813 each have a curved surface. This structure can increase optical design flexibility and reduce the thickness of the optical members 803, compared to the case where the reflective plate 812 and the reflective surface 813 are flat. Note that the reflective plate 812 and the reflective surface 813 may be flat.

The reflective plate 812 can use a component having a mirror surface and preferably has high reflectance. As the reflective surface 813, a half mirror utilizing reflection of a metal film may be used, but the use of a total-reflection prism or the like can increase the transmittance of the transmitted light 816.

Here, the housing 802 preferably includes a mechanism for adjusting the distance or angle between the lens 811 and the display panel 801. This enables focus adjustment and zooming in/out of an image, for example. One or both of the lens 811 and the display panel 801 are preferably configured to be movable in the optical-axis direction, for example.

The housing 802 preferably includes a mechanism capable of adjusting the angle of the reflective plate 812. The position of the display regions 806 where images are displayed can be changed by changing the angle of the reflective plate 812. Thus, the display regions 806 can be placed at the optimum position in accordance with the position of the user's eye.

The display apparatus or the display module of one embodiment of the present invention can be used for the display panels 801. Thus, the electronic device 800 can perform display with extremely high resolution.

Figure 19A:
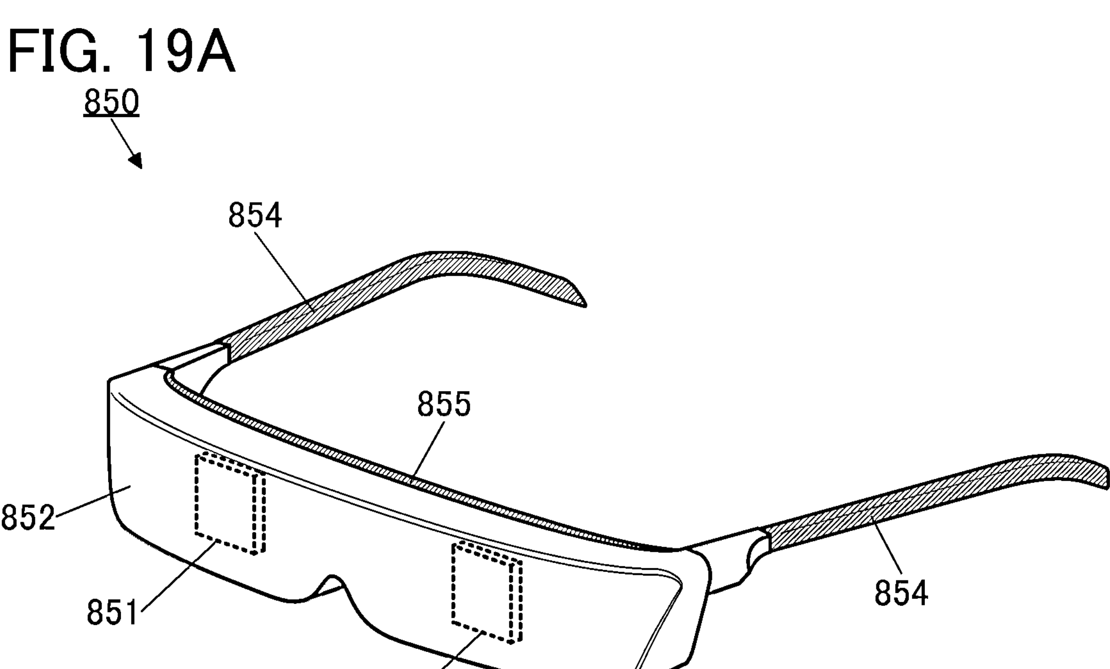
FIG. 19A and FIG. 19B are diagrams illustrating a structure example of an electronic device.
Figure 19B:
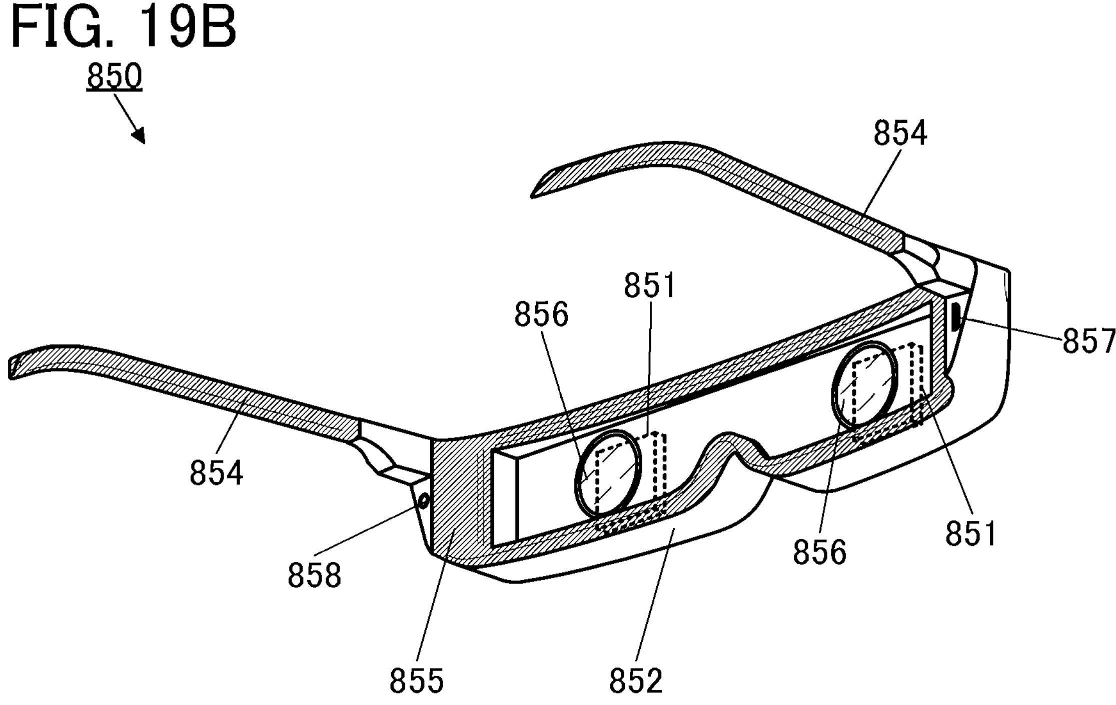

FIG. 19A and FIG. 19B illustrate perspective views of a goggle-type electronic device 850. FIG. 19A is a perspective view illustrating the front surface, the top surface, and the left side surface of the electronic device 850, and FIG. 19B is a perspective view illustrating the back surface, the bottom surface, and the right side surface of the electronic device 850.

The electronic device 850 includes a pair of display panels 851, a housing 852, a pair of temples 854, a cushion 855, a pair of lenses 856, and the like. The pair of display panels 851 is positioned to be seen through the lenses 856 inside the housing 852.

The electronic device 850 is an electronic device for VR. A user wearing the electronic device 850 can see an image displayed on the display panels 851 through the lenses 856. Furthermore, the pair of display panels 851 may display different images, whereby three-dimensional display using parallax can be performed.

An input terminal 857 and an output terminal 858 are provided on the back side of the housing 852. To the input terminal 857, a cable for supplying a video signal from a video output device or the like, power for charging a battery provided in the housing 852, or the like can be connected. The output terminal 858 can function as, for example, an audio output terminal to which earphones, headphones, or the like can be connected. Note that in the case where audio data can be output by wireless communication or sound is output from an external video output device, the audio output terminal is not necessarily provided.

The housing 852 preferably includes a mechanism by which the left and right positions of the lenses 856 and the display panels 851 can be adjusted to the optimal positions in accordance with the position of the user's eye. In addition, the housing 852 preferably includes a mechanism for adjusting focus by changing the distance between the lenses 856 and the display panels 851.

The display apparatus or the display module of one embodiment of the present invention can be used for the display panels 851. Thus, the electronic device 850 can perform display with extremely high resolution. This enables a user to feel a high sense of immersion.

The cushion 855 is a portion in contact with the user's face (forehead, cheek, or the like). The cushion 855 is in close contact with the user's face, so that light leakage can be prevented, which increases the sense of immersion. A soft material is preferably used for the cushion 855 so that the cushion 855 is in close contact with the face of the user wearing the electronic device 850. For example, a material such as rubber, silicone rubber, urethane, or sponge can be used. Furthermore, when a sponge or the like whose surface is covered with cloth, leather (natural leather or synthetic leather), or the like is used, a gap is unlikely to be generated between the user's face and the cushion 855, whereby light leakage can be suitably prevented. Furthermore, using such a material is preferable because it has a soft texture and the user does not feel cold when wearing the device in a cold season, for example. The member in contact with user's skin, such as the cushion 855 or the temples 854, is preferably detachable because cleaning or replacement can be easily performed.

At least part of this embodiment can be implemented in combination with the other embodiments described in this specification as appropriate.

Example

In this example, a display apparatus of one embodiment of the present invention was formed. The pixel circuit illustrated in FIG. 3C in Embodiment 1 was used for a pixel of the fabricated display apparatus. A transistor using an oxide semiconductor as a semiconductor where a channel is formed was used for each of the transistor M1 to the transistor M4. The transistor used for each of the transistor M1, the transistor M3, and the transistor M4 has a channel length of 200 nm and a channel width of 60 nm; and the transistor M2 has a structure where eight transistors were connected in series. FIG. 14 can be referred to for a cross-sectional structure of the fabricated display apparatus.

First, the electrical characteristics of the transistor used in the display apparatus are described. The fabricated transistor has a trench-gate self-aligned (TGSA) structure formed with an LSI process node, in which a top gate electrode and a back gate electrode are formed over and below a channel of an oxide semiconductor (OS) so as to cover it. A CAAC-OS film was used as the oxide semiconductor. The measured transistor has a channel length of approximately 200 nm and a channel width of approximately 60 nm. The transistor measured here has a structure where eight transistors are connected in series as the transistor M2.

Figure 20A:
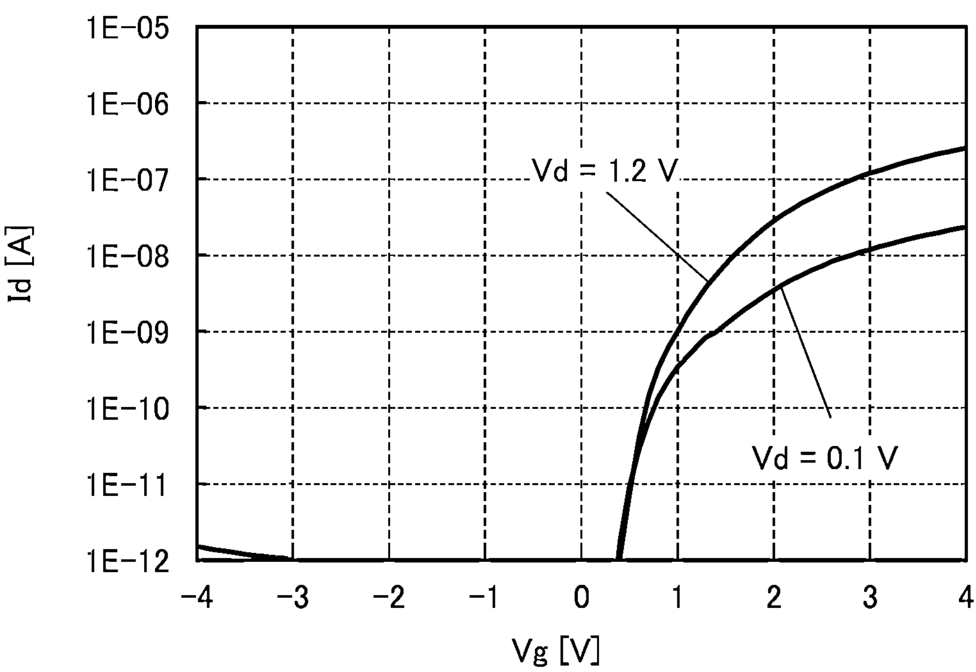
FIG. 20A and FIG. 20B show electrical characteristics of transistors of Example.

FIG. 20A shows measured Id-Vg characteristics. FIG. 20A shows two Id-Vg characteristics at drain voltages of 0.1 V and 1.2 V. In spite of being minute, the transistor exhibited normally-off characteristics as shown in FIG. 20A and off-state current was lower than or equal to the lower detection limit ($1\times10^{-12}$ A) of the measurement device.

Figure 20B:
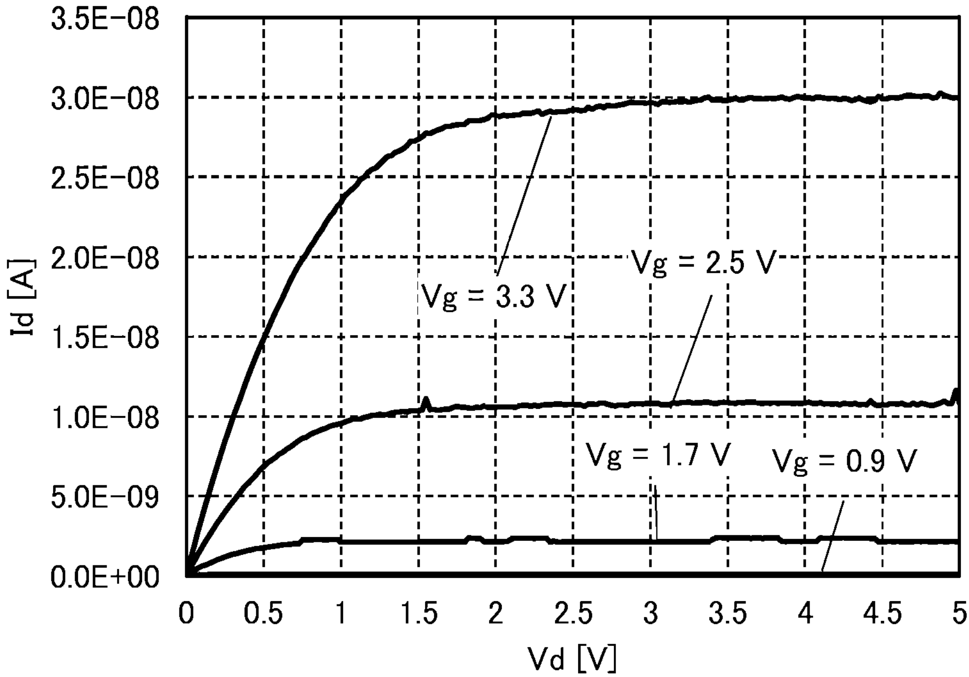

FIG. 20B shows Id-Vd characteristics. FIG. 20B shows four Id-Vd characteristics at gate voltages of 0.9 V, 1.7 V, 2.5 V, and 3.3 V. In spite of being minute, the transistor exhibited high saturation as shown in FIG. 20B.

The fabricated display apparatus had a structure in which a circuit (SiLSI) formed using a Si transistor (SiFET), a circuit (OSLSI) formed using an OS transistor (OSFET), and an OLED element were stacked. Table 1 shows specifications of the fabricated display apparatus. Table 1 shows, sequentially from top, the size of the display region, the resolution, the pixel size, the pixel density, the aperture ratio, the pixel arrangement, the coloring method, the emission type, the frame frequency, the source driver, the scan driver (the gate driver), and the stacked structure.

TABLE 1

| | |
|---|---|
| Screen diagonal | 0.99 inches |
| Resolution | 1920 × 1920 |
| Pixel size | 9.3 μm × 9.3 μm |
| Pixel density | 2731 ppi |
| Aperture ratio | 55.0% |
| Pixel arrangement | s-stripe |
| Coloring method | Side-by-side |
| Emission type | Top emission |
| Frame frequency | 90 Hz |
| Source driver | Integrated (SiFET) |
| Scan driver | Integrated (SiFET) |
| Structure | OSLSI/SiLSI |

In particular, as the coloring method, Side-by-Side method in which light-emitting elements for red (R), green (G), and blue (B) colors are separately formed by a photolithography method without using a metal mask was used. The pixel circuit was formed using the OS transistor, and the driver circuits such as the source driver and the scan driver were formed using the Si transistor.

Figure 21:
FIG. 21 is a photograph showing the display state of a display panel of Example.

FIG. 21 shows a photograph displayed by the fabricated display apparatus. The display apparatus has a structure in which the OS transistor is stacked over the Si transistor and the OS transistor whose channel length is 200 nm is used; and extremely high resolution as high as 2731 ppi is achieved. It was confirmed that a favorable image is displayed by the display apparatus.

Figure 22A:
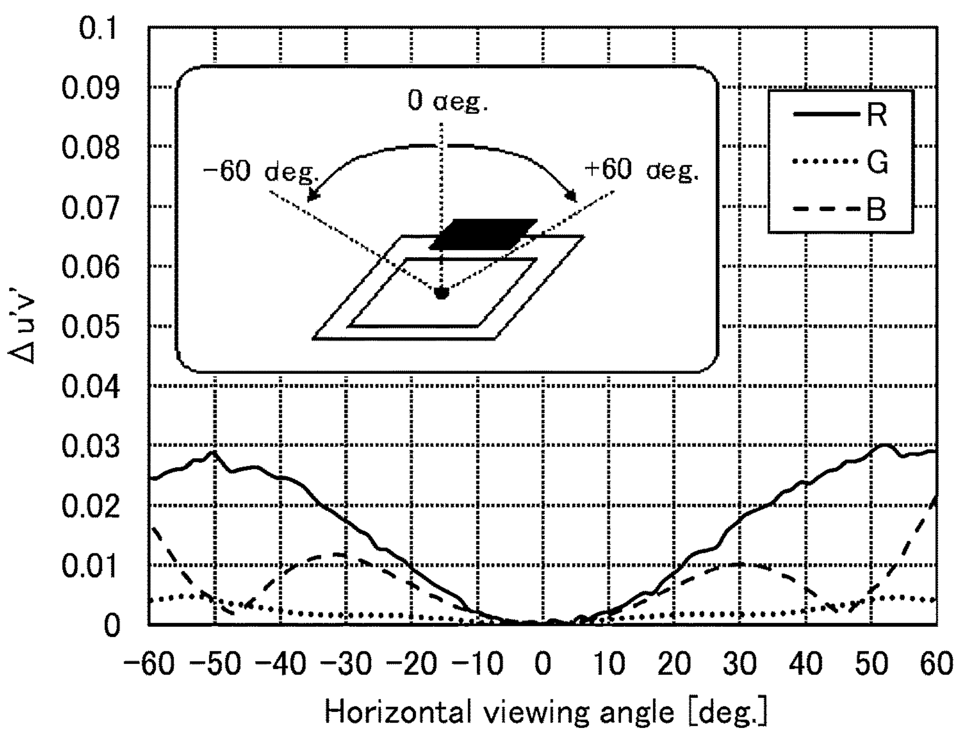
FIG. 22A and FIG. 22B show measurement results of viewing angle dependence of a display panel of Example.
Figure 22B:
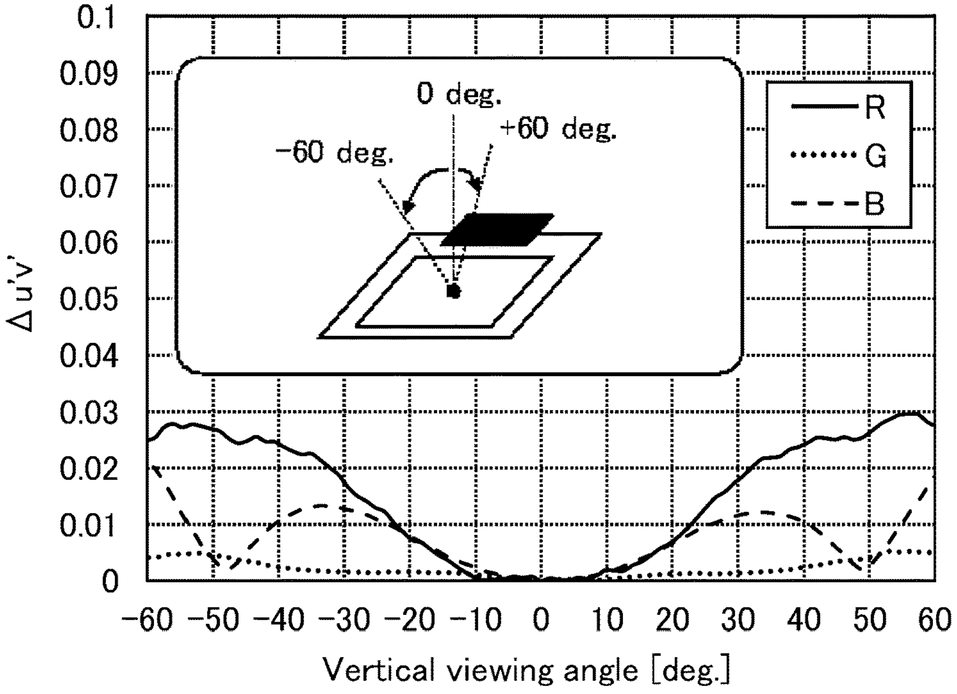

Next, the viewing angle dependence of chromaticity of each of R, G, and B in the fabricated display apparatus was measured. FIG. 22A and FIG. 22B show measurement results of the viewing angle dependence. Schematic views of the measurement direction are included in FIG. 22A and FIG. 22B. FIG. 22A and FIG. 22B show the results of the viewing angle in the horizontal direction and in the vertical direction, respectively. In each graph, the horizontal axis represents angle (horizontal viewing angle or vertical viewing angle) when the normal direction of the display surface is regarded as 0°, and the vertical axis represents rate of change in chromaticity (Δu'v') when 0° is set to 0.

As shown in FIG. 22A and FIG. 22B, it was confirmed that Δu'v' is less than or equal to 0.03 in the viewing angle range of ±60° C. in both the horizontal direction and the vertical direction.

Figure 23:
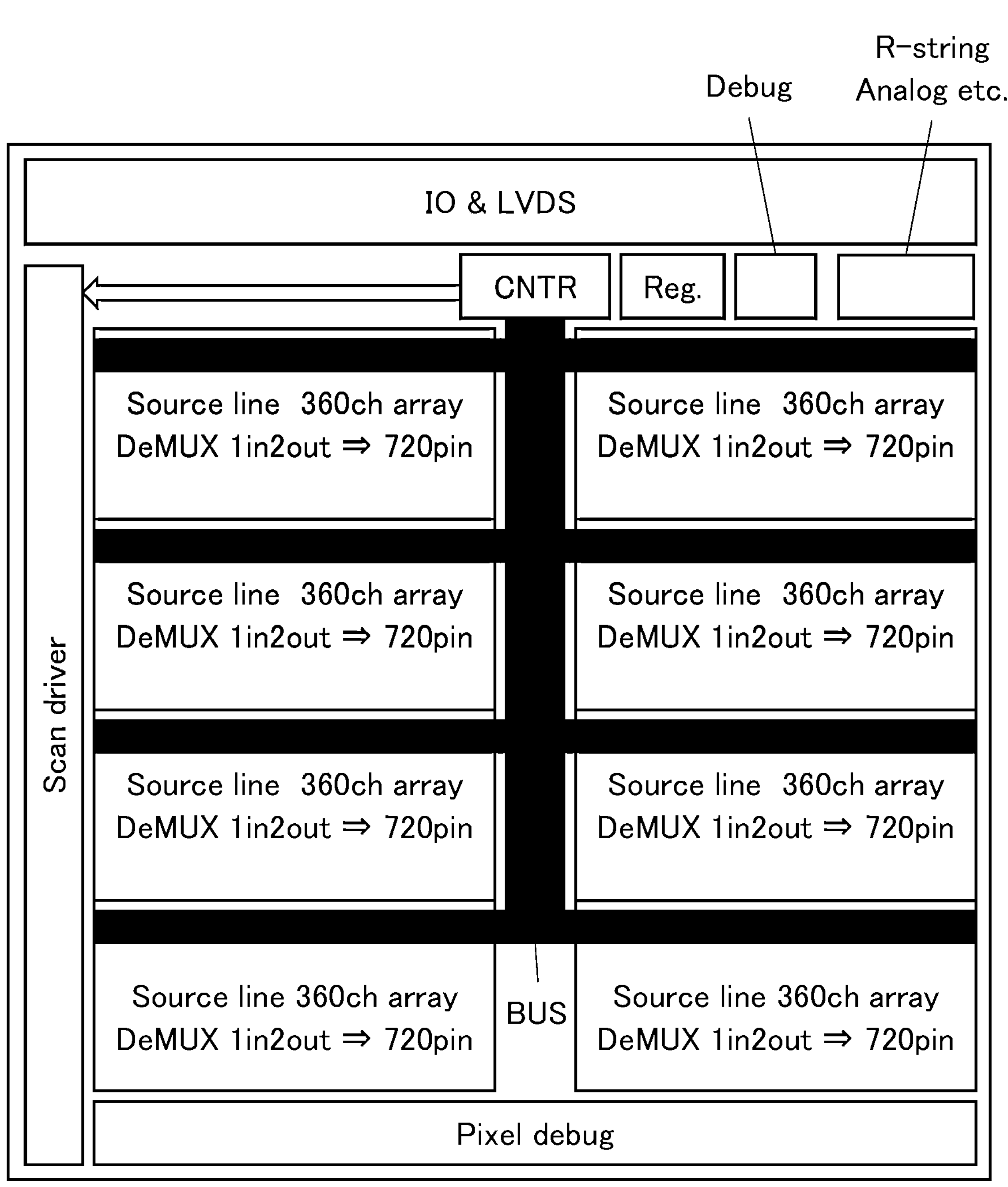
FIG. 23 is a block diagram of a driver circuit of a display panel of Example.

Next, FIG. 23 shows a block diagram of a driver circuit portion in the fabricated display apparatus. Here, eight (2×4) source drivers including output terminals of 360 channels are arranged under the display region. Each of the eight circuits is connected to a controller (CNTR) through a bus line (BUS). In addition, the driver circuit portion includes a scan driver, a one-input two-output DeMUX circuit, an input-output (IO), a LVDS circuit, a debug circuit (Pixel debug), and the like.

Figure 24:
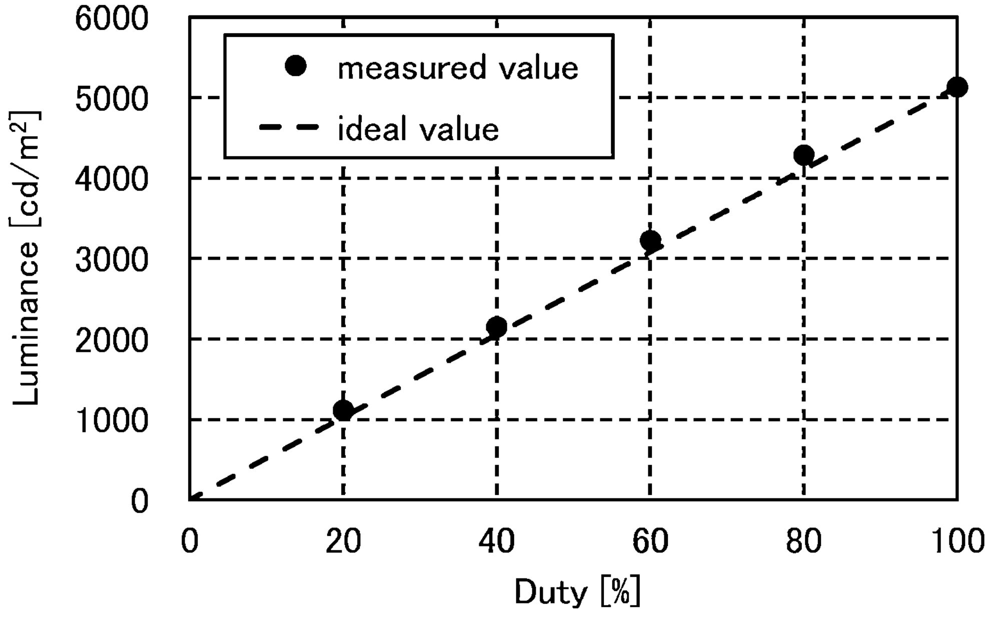
FIG. 24 shows measurement result of the luminance in the duty driving of the display panel of Example.

The fabricated display apparatus is capable of duty driving shown in FIG. 3 and FIG. 4 in Embodiment 1. FIG. 24 shows the measurement result of change in luminance when the fabricated display apparatus was driven with the duty ratio changing. In FIG. 24, the horizontal axis represents duty ratio (Duty [%]), and the vertical axis represents luminance (Luminance [cd/m$^2$]). In the graph, the dashed line represents ideal values, and the plot represents measured values. As shown in FIG. 24, it was confirmed that the luminance changes linearly with respect to the duty ratio and is substantially equal to the ideal value. It was confirmed that the fabricated display apparatus achieved white display with luminance higher than or equal to 5000 cd/m$^2$ when the duty ratio was 100%.

The display apparatus of one embodiment of the present invention enables not only arrangement of various functional circuits, besides a driver circuit, under the display region but also higher functionality, narrower frame, smaller chip size, and smaller number of external terminals than a conventional display apparatus.

REFERENCE NUMERALS

10: transistor, 10_a-h_: transistor, 11: dummy transistor, 12B: light-emitting element, 12G: light-emitting element, 12R: light-emitting element, 20: pixel, 20B: subpixel, 20G: subpixel, 20R: subpixel, 20X: subpixel, 21: conductive layer, 22: conductive layer, 23: conductive layer, 24: pixel electrode, 29: dummy layer, 30_a-d_: transistor, 31: semiconductor layer, 31_a_: semiconductor layer, 31_b_: semiconductor layer, 31_i_: region, 31_n_: region, 32: dummy layer, 41: contact portion, 42: contact portion, 51: insulating layer, 52: insulating layer

The invention claimed is:

1. A display apparatus comprising:

a first wiring;

a second wiring;

a first transistor; and a plurality of second transistors, wherein the first wiring extends in a first direction and is supplied with a gate signal, wherein the second wiring extends in a second direction intersecting the first direction and is supplied with a source signal, wherein a gate of the first transistor is electrically connected to the first wiring, wherein one of a source and a drain of the first transistor is electrically connected to the second wiring, wherein the other of the source and the drain of the first transistor is electrically connected to a first gate of a third transistor of the plurality of second transistors and a second gate of a fourth transistor of the plurality of second transistors, wherein the plurality of second transistors are connected in series, wherein the first transistor comprises a first semiconductor layer where current flows in the first direction or the second direction, and wherein the third transistor of the plurality of second transistors comprises a second semiconductor layer where current flows in the first direction or the second direction.

2. The display apparatus according to claim 1, further comprising a light-emitting element, wherein the light-emitting element comprises an anode and a cathode, and wherein one of a source and a drain of the fourth transistor of the plurality of second transistors is electrically connected to one of the anode and the cathode of the light-emitting element.

3. The display apparatus according to claim 1, wherein a channel length of the third transistor of the plurality of second transistors is substantially equal to a channel length of the fourth transistor of the plurality of second transistors, and wherein a channel width of the third transistor of the plurality of second transistors is substantially equal to a channel width of the fourth transistor of the plurality of second transistors.

4. The display apparatus according to claim 1, wherein channel lengths of the first transistor and the third transistor of the plurality of second transistors are substantially equal to each other, and wherein channel widths of the first transistor and the third transistor of the plurality of second transistors are substantially equal to each other.

5. The display apparatus according to claim 1, wherein two adjacent second transistors in the plurality of second transistors share one island-shaped semiconductor layer.

6. The display apparatus according to claim 1, wherein the third transistor of the plurality of second transistors and the fourth transistor of the plurality of second transistors comprise the second semiconductor layer, and wherein a plurality of the second semiconductor layers is arranged at regular intervals in the first direction or the second direction.

7. The display apparatus according to claim 1, wherein the second semiconductor layer comprises a metal oxide containing one or both of indium and zinc.

8. The display apparatus according to claim 7, wherein the first semiconductor layer comprises a metal oxide layer, and wherein the metal oxide of the first semiconductor layer and the metal oxide of the second semiconductor layer are the same.

9. The display apparatus according to claim 1, further comprising a fifth transistor, wherein the fifth transistor comprises a third semiconductor layer, wherein the third semiconductor layer comprises the same semiconductor material as the first semiconductor layer, and comprises a portion having substantially the same top surface shape as the first semiconductor layer, and wherein at least one of a gate, a source and a drain of the fifth transistor is electrically floating.

10. The display apparatus according to claim 1, wherein two adjacent transistors in the plurality of second transistors share one island-shaped semiconductor layer.

11. A display apparatus comprising:

a first wiring;

a second wiring;

a first transistor; and a plurality of second transistors, wherein the first wiring extends in a first direction and is supplied with a gate signal, wherein the second wiring extends in a second direction intersecting the first direction and is supplied with a source signal, wherein a gate of the first transistor is electrically connected to the first wiring, wherein one of a source and a drain of the first transistor is electrically connected to the second wiring, wherein the other of the source and the drain of the first transistor is electrically connected to a first gate of a third transistor of the plurality of second transistors and a second gate of a fourth transistor of the plurality of second transistors, wherein a source of the third transistor of the plurality of second transistors is electrically connected to a source of the fourth transistor of the plurality of second transistors and a drain of the third transistor of the plurality of second transistors is electrically connected to a drain of the fourth transistor of the plurality of second transistors, wherein the first transistor comprises a first semiconductor layer where current flows in the first direction or the second direction, and wherein the third transistor of the plurality of second transistors comprises a second semiconductor layer where current flows in the first direction or the second direction.

12. The display apparatus according to claim 11, further comprising a light-emitting element, wherein the light-emitting element comprises an anode and a cathode, and wherein one of the source and the drain of the fourth transistor of the plurality of second transistors is electrically connected to one of the anode and the cathode of the light-emitting element.

13. The display apparatus according to claim 11, wherein a channel length of the third transistor of the plurality of second transistors is substantially equal to a channel length of the fourth transistor of the plurality of second transistors, and wherein a channel width of the third transistor of the plurality of second transistors is substantially equal to a channel width of the fourth transistor of the plurality of second transistors.

14. The display apparatus according to claim 11, wherein channel lengths of the first transistor and the third transistor of the plurality of second transistors are substantially equal to each other, and wherein channel widths of the first transistor and the third transistor of the plurality of second transistors are substantially equal to each other.

15. The display apparatus according to claim 11, wherein the third transistor of the plurality of second transistors and the fourth transistor of the plurality of second transistors comprise the second semiconductor layer, and wherein a plurality of the second semiconductor layers is arranged at regular intervals in the first direction or the second direction.

16. The display apparatus according to claim 11, wherein the second semiconductor layer comprises a metal oxide containing one or both of indium and zinc.

17. The display apparatus according to claim 16, wherein the first semiconductor layer comprises a metal oxide, and wherein the metal oxide of the first semiconductor layer and the metal oxide of the second semiconductor layer are the same.

18. The display apparatus according to claim 11, further comprising a fifth transistor, wherein the fifth transistor comprises a third semiconductor layer, wherein the third semiconductor layer comprises the same semiconductor material as the first semiconductor layer, and comprises a portion having substantially the same top surface shape as the first semiconductor layer, and wherein at least one of a gate, a source and a drain of the fifth transistor is electrically floating.

19. A display apparatus comprising:

a first wiring;

a second wiring;

a first transistor;

a plurality of second transistors;

a capacitor; and a light-emitting element, wherein the first wiring is supplied with a gate signal, wherein the second wiring is supplied with a source signal, wherein a gate of the first transistor is electrically connected to the first wiring, wherein one of a source and a drain of the first transistor is electrically connected to the second wiring, wherein the other of the source and the drain of the first transistor is electrically connected to a first gate of a third transistor of the plurality of second transistors, a second gate of a fourth transistor of the plurality of second transistors, and one electrode of the capacitor, wherein one of the source and the drain of the third transistor is electrically connected to a third wiring, wherein the other of the source and the drain of the third transistor is electrically connected to one of a source and a drain of the fourth transistor, and wherein the other of the source and the drain of the fourth transistor is electrically connected to the other electrode of the capacitor and one electrode of the light-emitting element.

* * * * *